(12) United States Patent
Xiao et al.

(10) Patent No.: US 12,490,605 B2
(45) Date of Patent: Dec. 2, 2025

(54) DISPLAY PANEL AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Bangqing Xiao, Beijing (CN); Zhuoran Yan, Beijing (CN); Cong Liu, Beijing (CN); Binyan Wang, Beijing (CN); Yao Huang, Beijing (CN); Shuang Li, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/026,000

(22) PCT Filed: Jan. 30, 2022

(86) PCT No.: PCT/CN2022/075168
§ 371 (c)(1),
(2) Date: Mar. 13, 2023

(87) PCT Pub. No.: WO2023/142105
PCT Pub. Date: Aug. 3, 2023

(65) Prior Publication Data
US 2024/0298484 A1    Sep. 5, 2024

(51) Int. Cl.
*H10K 59/131* (2023.01)
*H10K 59/13* (2023.01)

(52) U.S. Cl.
CPC ........... *H10K 59/131* (2023.02); *H10K 59/13* (2023.02)

(58) Field of Classification Search
None
See application file for complete search history.

(56) References Cited

U.S. PATENT DOCUMENTS

2020/0411611 A1* 12/2020 Liu .............. H10K 59/131
2021/0359075 A1* 11/2021 Liu .............. H10K 59/80515

* cited by examiner

*Primary Examiner* — Khaja Ahmad
(74) *Attorney, Agent, or Firm* — Collard & Roe, P.C.

(57) ABSTRACT

Provided are a display panel and a display device. The display panel includes: a pixel unit including a pixel circuit and a light-emitting element; a data line connected with the pixel circuit, the data line includes first-type data lines and second-type data lines, the second-type data line includes a first portion, a second portion, and a third portion, the third portion is connected with the first portion through a first via hole, the third portion is connected with the second portion through a second via hole, and the third portion includes a main trace located between the first via hole and the second via hole, at least one third portion includes a compensation trace, the compensation trace of the third portion is located at least one end of the main trace of the third portion, lengths of the plurality of third portions are equal or approximately equal.

20 Claims, 31 Drawing Sheets

DISPLAY PANEL AND DISPLAY DEVICE

CROSS REFERENCE TO RELATED APPLICATIONS

This application is the National Stage of PCT/CN2022/075168 filed on Jan. 30, 2022, the disclosure of which is incorporated by reference.

TECHNICAL FIELD

At least one embodiment of the present disclosure relates to a display panel and a display device.

BACKGROUND

With the continuous development of display technology, active-matrix organic light-emitting diode (AMOLED) display technology has been more and more used in mobile phones, tablet computers, digital cameras, and other display devices due to its advantages such as self-luminescence, wide viewing angle, high contrast, low power consumption, and high response speed, and the like.

An under-screen camera technology is a brand-new technology proposed to increase the screen-to-body ratio of a display device.

SUMMARY

At least one embodiment of the present disclosure relates to a display panel and a display device.

At least one embodiment of the present disclosure provides a display panel, including: a base substrate; a pixel unit, located on the base substrate, including a pixel circuit and a light-emitting element, the pixel circuit being configured to drive the light-emitting element; and a data line, connected with the pixel circuit, and configured to supply a data voltage to the pixel circuit, the data line including a plurality of first-type data lines and a plurality of second-type data lines, the plurality of first-type data lines are arranged in a first direction, each of the plurality of first-type data lines extends in a second direction, and the first direction intersects with the second direction, each of the plurality second-type data lines includes a first portion, a second portion, and a third portion, the first portion is connected with the second portion by the third portion, the third portion is connected with the first portion through a first via hole, the third portion is connected with the second portion through a second via hole, and the third portion includes a main trace located between the first via hole and the second via hole, the first portion and the second portion both extend in the second direction, and the third portion extends in the first direction, at least one third portion of a plurality of third portions of the plurality of second-type data lines includes a compensation trace, the compensation trace of the third portion is located at least one end of the main trace of the third portion, lengths of the plurality of third portions of the plurality of second-type data lines are equal or a ratio of a length difference between two adjacent third portions and an average length of the two adjacent third portions is less than or equal to 5%.

According to the display panel provided by an embodiment of the present disclosure, the plurality of third portions form a rectangle or a parallelogram.

According to the display panel provided by an embodiment of the present disclosure, the compensation trace of the third portion includes a first compensation trace, the first compensation trace is located at one end of the third portion, in the second direction, lengths of a plurality of first compensation traces gradually change.

According to the display panel provided by an embodiment of the present disclosure, in the second direction, the lengths of the plurality of first compensation traces gradually increase or gradually decrease.

According to the display panel provided by an embodiment of the present disclosure, the plurality of first compensation traces form a trapezoid or a triangle.

According to the display panel provided by an embodiment of the present disclosure, the compensation trace of the third portion further includes a second compensation trace, the first compensation trace and the second compensation trace are located at both ends of the third portion, respectively, lengths of a plurality of second compensation traces gradually change, in the second direction, a length change trend of the plurality of first compensation traces is the same as a length change trend of the plurality of second compensation traces.

According to the display panel provided by an embodiment of the present disclosure, the main trace of the third portion, the first compensation trace, and the second compensation trace are of an integral structure.

According to the display panel provided by an embodiment of the present disclosure, the second-type data line further includes a fourth portion and a fifth portion, the fourth portion extends in the second direction, the fifth portion extends in the first direction, the first portion is connected with the fourth portion by the fifth portion, the fifth portion is connected with the first portion through a third via hole, and the fifth portion is connected with the fourth portion through a fourth via hole, the fifth portion includes a main trace located between the third via hole and the fourth via hole, at least one fifth portion of a plurality of fifth portions of the plurality of second-type data lines includes a compensation trace, the compensation trace of the fifth portion is located at at least one end of the main trace of the fifth portion, lengths of a plurality of the fifth portions of the plurality of second-type data lines are equal or a ratio of a length difference between two adjacent fifth portions and an average length of the two adjacent fifth portions is less than or equal to 5%.

According to the display panel provided by an embodiment of the present disclosure, the plurality of fifth portions form a rectangle or a parallelogram.

According to the display panel provided by an embodiment of the present disclosure, the compensation trace of the fifth portion includes a third compensation trace, the third compensation trace is located at one end of the fifth portion, and in the second direction, lengths of a plurality of third compensation traces gradually change.

According to the display panel provided by an embodiment of the present disclosure, in the second direction, the lengths of the plurality of third compensation traces gradually increase or gradually decrease.

According to the display panel provided by an embodiment of the present disclosure, the plurality of third compensation traces form a trapezoid or a triangle.

According to the display panel provided by an embodiment of the present disclosure, the compensation trace of the fifth portion further includes a fourth compensation trace, the third compensation trace and the fourth compensation trace are located at both ends of the fifth portion, respectively, lengths of a plurality of fourth compensation traces gradually change, in the second direction, a length change trend of the plurality of third compensation traces is the same as a length change trend of the plurality of fourth compensation traces.

According to the display panel provided by an embodiment of the present disclosure, the main trace of the fifth portion, the third compensation trace, and the fourth compensation trace are of an integral structure.

According to the display panel provided by an embodiment of the present disclosure, the first portion includes a main trace located between the first via hole and the third via hole, at least one first portion of a plurality of first portions of the plurality of second-type data lines includes a compensation trace, the compensation trace of the first portion is located at least one end of the main trace of the first portion, lengths of the plurality of first portions of the plurality of second-type data lines are equal or a ratio of a length difference between two adjacent first portions and an average length of the two adjacent first portions is less than or equal to 5%.

According to the display panel provided by an embodiment of the present disclosure, the plurality of first portions form a rectangle or a parallelogram.

According to the display panel provided by an embodiment of the present disclosure, the compensation trace of the first portion includes a fifth compensation trace, the fifth compensation trace is located at one end of the first portion, in the first direction, lengths of a plurality of fifth compensation traces gradually change.

According to the display panel provided by an embodiment of the present disclosure, in the first direction, the lengths of the plurality of fifth compensation traces gradually increase or gradually decrease.

According to the display panel provided by an embodiment of the present disclosure, the plurality of fifth compensation traces form a trapezoid or a triangle.

According to the display panel provided by an embodiment of the present disclosure, the compensation trace of the first portion further includes a sixth compensation trace, the fifth compensation trace and the sixth compensation trace are located at both ends of the main trace of the first portion, respectively, lengths of a plurality of sixth compensation traces gradually change, in the first direction, a length change trend of the plurality of fifth compensation traces is the same as a length change trend of the plurality of sixth compensation traces.

According to the display panel provided by an embodiment of the present disclosure, the main trace of the first portion, the fifth compensation trace, and the sixth compensation trace are of an integral structure.

According to the display panel provided by an embodiment of the present disclosure, the fourth portion includes a main trace located between the fourth via hole and the second display region, at least one fourth portion of a plurality of fourth portions of the plurality of second-type data lines includes a compensation trace, the compensation trace of the fourth portion is located at one end of the main trace of the fourth portion away from the second display region, lengths of the plurality of fourth portions of the plurality of second-type data lines are equal or a ratio of a length difference between two adjacent fourth portions and an average length of the two adjacent fourth portions is less than or equal to 5%.

According to the display panel provided by an embodiment of the present disclosure, the plurality of fourth portions form a rectangle or a parallelogram.

According to the display panel provided by an embodiment of the present disclosure, the compensation trace of the fourth portion includes a seventh compensation trace, the seventh compensation trace is located at one end of the fourth portion, and in the second direction, lengths of a plurality of seventh compensation traces gradually change.

According to the display panel provided by an embodiment of the present disclosure, in the first direction, the lengths of the plurality of seventh compensation traces gradually increase or gradually decrease.

According to the display panel provided by an embodiment of the present disclosure, the plurality of seventh compensation traces form a trapezoid or a triangle.

According to the display panel provided by an embodiment of the present disclosure, lengths of the plurality of second-type data lines are equal or a ratio of a length difference of the plurality of second-type data lines and an average length of the plurality of second-type data lines is less than or equal to 5%.

According to the display panel provided by an embodiment of the present disclosure, a length of the second-type data line is greater than a length of the first-type data line.

According to the display panel provided by an embodiment of the present disclosure, a ratio of a length of the first-type data line to a length of the second-type data line is greater than or equal to 0.85 and less than or equal to 0.95.

According to the display panel provided by an embodiment of the present disclosure, the base substrate includes a first display region and a second display region, and the first display region is located on at least one side of the second display region, the pixel unit includes a first pixel unit and a second pixel unit, the pixel circuit and the light-emitting element of the first pixel unit are located in the first display region, the pixel circuit of the second pixel unit is located in the first display region, the light-emitting element of the second pixel unit is located in the second display region, the pixel circuit of the second pixel unit is connected with the light-emitting element of the second pixel unit by a conductive line, an orthographic projection of the compensation trace of the third portion on the base substrate does not overlap with an orthographic projection of the conductive line on the base substrate.

At least one embodiment of the present disclosure further provides a display device, including any one of the display panels as mentioned above.

For example, in some embodiments of the present disclosure, the display device further includes a photosensitive sensor, the photosensitive sensor is located on one side of the display panel.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not construed as any limitation to the present disclosure.

DETAILED DESCRIPTION

Figure 1A:
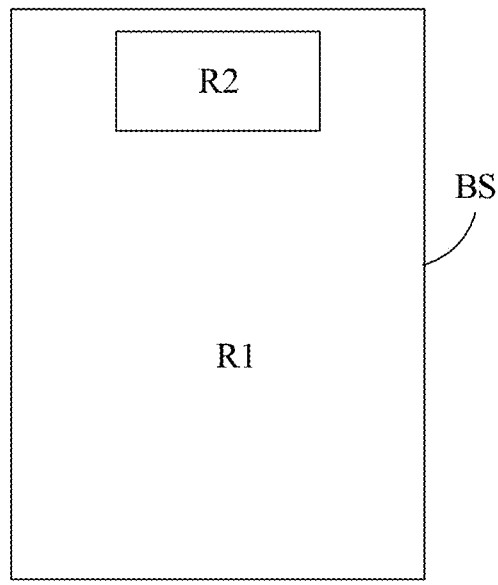
FIG. 1A is a schematic diagram illustrating a structure of a display panel provided by an embodiment of the present disclosure.

In order to make objectives, technical details, and advantages of the embodiments of the present disclosure more clear, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the described object is changed, the relative position relationship may be changed accordingly.

With development of a display technology, the existing design of notch screen or water drop screen gradually cannot meet users' demand for a high screen-to-body ratio of a display panel, and a series of display panels having a light-transmitting display region have emerged as times require. In such type of display panel, a device such as a photosensitive sensor (e.g., a camera) may be provided in the light-transmitting display region; because there is no need to punch a hole, it is possible to realize a true full screen under the premise of ensuring practicability of the display panel.

In a related art, a display panel with an under-screen camera generally includes a first display region for normal display and a second display region for providing a camera. The second display region generally includes: a plurality of light-emitting elements and a plurality of pixel circuits. Each pixel circuit is connected with a light-emitting element and used to drive the light-emitting element to emit light, and the pixel circuit and the light-emitting element that are connected with each other overlap with each other in a direction perpendicular to the display panel.

Because the second display region in the related art is further provided with pixel circuits, light transmittance of the second display region is poor, and accordingly, a display effect of the display panel is poor.

Figure 1B:
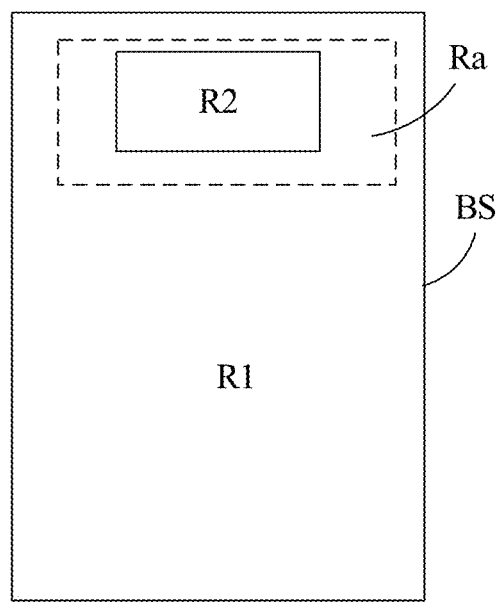
FIG. 1B is a schematic diagram illustrating a structure of a display panel provided by an embodiment of the present disclosure.

FIG. 1A is a schematic diagram illustrating a structure of a display panel provided by an embodiment of the present disclosure. FIG. 1B is a schematic diagram illustrating a structure of a display panel provided by an embodiment of the present disclosure. As illustrated in FIG. 1A and FIG. 1B, the display panel may include: a base substrate BS. The display panel includes a first display region R1 and a second display region R2; and the first display region R1 may be located on at least one side of the second display region R2. For example, in some embodiments, the first display region R1 surrounds the second display region R2. That is, the second display region R2 may be surrounded by the first display region R1. The second display region R2 may also be arranged in other positions; and the arrangement position of the second display region R2 may be determined as needed. For example, the second display region R2 may be located in a top middle position of the base substrate BS, or may also be located in an upper left corner position or an upper right corner position of the base substrate BS. For example, a device such as a photosensitive sensor (e.g., a camera) is provided in the second display region R2 of the display panel. For example, the second display region R2 is a light-transmitting display region; and the first display region R1 is a display region. For example, the first display region R1 is opaque and only used for display. FIG. 1B illustrates that the first display region R1 includes an auxiliary region Ra.

Figure 2:
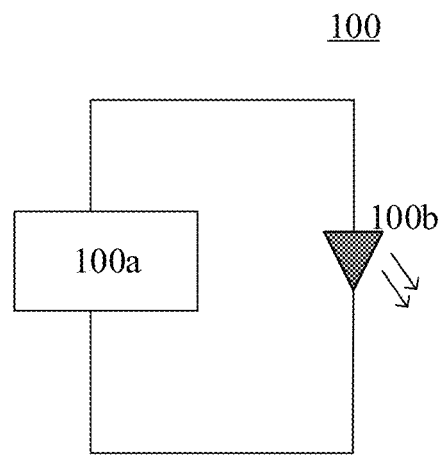
FIG. 2 is a schematic diagram of a pixel unit of a display panel provided by an embodiment of the present disclosure.

FIG. 2 is a schematic diagram of a pixel unit of a display panel provided by an embodiment of the present disclosure. The display panel includes a pixel unit 100, and the pixel unit 100 is located on a base substrate. As illustrated in FIG. 2, the pixel unit 100 includes a pixel circuit 100a and a light-emitting element 100b; and the pixel circuit 100a is configured to drive the light-emitting element 100b. For example, the pixel circuit 100a is configured to supply a driving current to drive the light-emitting element 100b to emit light. For example, the light-emitting element 100b is an Organic Light-Emitting Diode (OLED); and the light-emitting element 100b emits red light, green light, blue light, or white light, etc., under the driving of a pixel circuit 100a corresponding thereto, a light-emitting color of the light-emitting element 100b may be determined as needed.

In order to increase light transmittance of the second display region R2, the second display region R2 may be provided with only light-emitting elements, while the pixel circuits for driving the light-emitting elements of the second display region R2 may be provided in the first display region R1. That is, the light transmittance of the second display region R2 is increased by separately arranging the light-emitting element and the pixel circuit. That is, the second display region R2 is not provided with the pixel circuit 100a.

Figure 3:
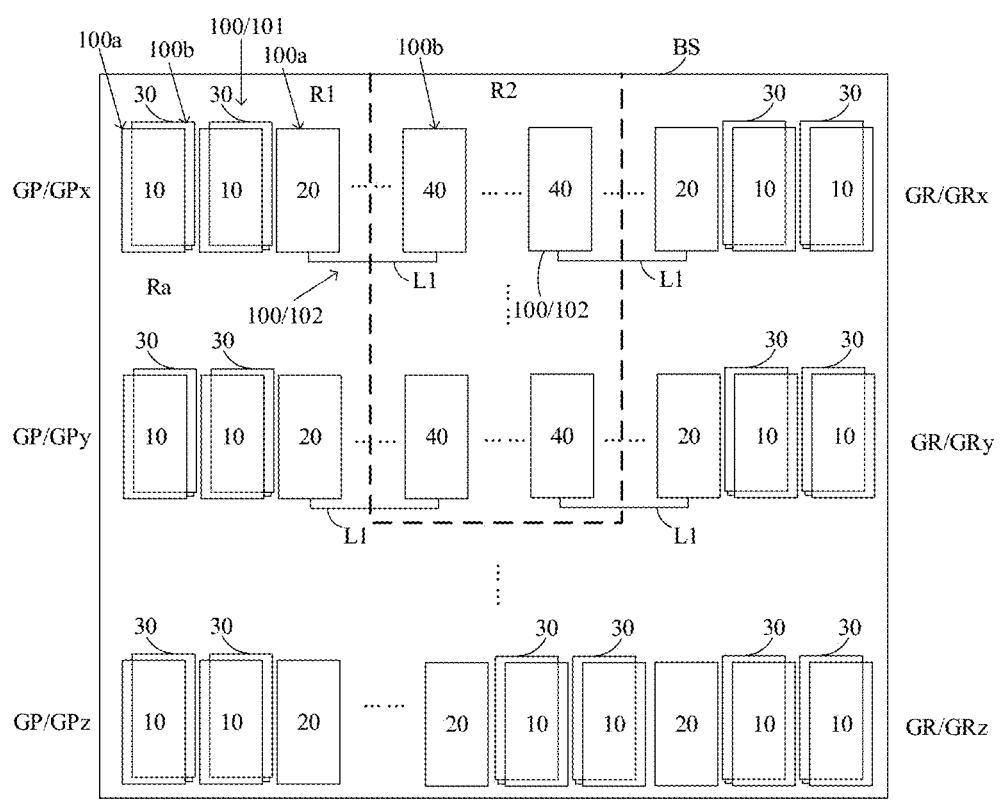
FIG. 3 is a schematic diagram of a display panel provided by an embodiment of the present disclosure.

FIG. 3 is a schematic diagram of a display panel provided by an embodiment of the present disclosure. As illustrated in FIG. 3, the display panel includes: a plurality of first-type pixel circuits 10, a plurality of second-type pixel circuits 20, and a plurality of first-region light-emitting elements 30 that are located in a first display region R1; as well as a plurality of second-region light-emitting elements 40 located in a second display region R2. For example, the plurality of second-type pixel circuits 20 may be distributed at intervals among the plurality of first-type pixel circuits 10.

For example, as illustrated in FIG. 3, at least one first-type pixel circuit 10 among the plurality of first-type pixel circuits 10 may be connected with at least one first-region light-emitting element 30 among the plurality of first-region light-emitting elements 30; and an orthographic projection of the at least one first-type pixel circuit 10 on the base substrate BS may at least partially overlap with an orthographic projection of the at least one first-region light-emitting element 30 on the base substrate BS. The at least one first-type pixel circuit 10 may be used to supply a driving signal to the first-region light-emitting element 30 connected therewith, to drive the first-region light-emitting element 30 to emit light.

For example, as illustrated in FIG. 3, at least one second-type pixel circuit 20 among the plurality of second-type pixel circuits 20 may be connected with at least one second-region light-emitting element 40 among the plurality of second-region light-emitting elements 40 through a conductive line L1; and the at least one second-type pixel circuit 20 may be used to supply a driving signal to the second-region light-emitting element 40 connected therewith, to drive the second-region light-emitting element 40 to emit light. As illustrated in FIG. 3, because the second-region light-emitting element 40 and the second-type pixel circuit 20 are located in different regions, there is no overlapping portion between an orthographic projection of at least one second-type pixel circuit 20 on the base substrate BS and an orthographic projection of at least one second-region light-emitting element 40 on the base substrate BS. That is, the orthographic projection of the second-type pixel circuit 20 on the base substrate BS does not overlap with the orthographic projection of the second-region light-emitting element 40 on the base substrate BS.

For example, in the embodiments of the present disclosure, the first display region R1 may be arranged as a non-light-transmitting display region; and the second display region R2 may be arranged as a light-transmitting display region. For example, the first display region R1 cannot transmit light; and the second display region R2 can transmit light. In this way, the display panel provided by the embodiments of the present disclosure may have the required device structure such as the photosensitive sensor directly arranged in a position corresponding to the second display region R2 on a side of the display panel, without performing digging process on the display panel to form a hole, which lays a solid foundation for implementing a true full screen. In addition, because the second display region R2 only includes light-emitting elements and does not include pixel circuits, it is favorable for increasing light transmittance of the second display region R2, so that the display panel has a better display effect.

As illustrated in FIG. 3, the pixel unit 100 includes a first pixel unit 101 and a second pixel unit 102; the pixel circuit 100a and the light-emitting element 100b of the first pixel unit 101 are both located in the first display region R1; the pixel circuit 100a of the second pixel unit 101 is located in the first display region R1; and the light-emitting element 100b of the second pixel unit 102 is located in the second display region R2. In the embodiments of the present disclosure, the pixel circuit 100a of the first pixel unit 101 is the first-type pixel circuit 10; the light-emitting element 100b of the first pixel unit 101 is the first-region light-emitting element 30; the pixel circuit 100a of the second pixel unit 101 is the second-type pixel circuit 20; and the light-emitting element 100b of the second pixel unit 102 is the second-region light-emitting element 40. For example, the first-region light-emitting element 30 may be referred to as an in-situ light-emitting element. For example, the first-type pixel circuit 10 may be referred to as an in-situ pixel circuit; and the second-type pixel circuit 20 may be referred to as an ex-situ pixel circuit.

For example, as illustrated in FIG. 3, the second-region light-emitting element 40 and the second-type pixel circuit 20 connected with the second-region light-emitting element 40 are located in the same row. That is, light-emitting signals of the second-region light-emitting elements 40 come from second-type pixel circuit in the same row. For example, pixel circuits of pixel units in the same row are connected with the same gate line.

As illustrated in FIG. 3, the pixel circuit (the second-type pixel circuit 20) of the second pixel unit 102 is connected with the light-emitting element (the second-region light-emitting element 40) of the second pixel unit 102 through a conductive line L1. For example, the conductive line L1 is made of a transparent conductive material. For example, the conductive line L1 is made of a conductive oxide material. For example, the conductive oxide material includes, but is not limited to, Indium Tin Oxide (ITO).

As illustrated in FIG. 3, one end of the conductive line L1 is connected with the second-type pixel circuit 20; and the other end of the conductive line L1 is connected with the second-region light-emitting element 40. As illustrated in FIG. 3, the conductive line L1 extends from the first display region R1 to the second display region R2.

As illustrated in FIG. 1B and FIG. 3, in some embodiments, the first display region R1 may include an auxiliary region Ra; and the auxiliary region Ra may be provided with the second-type pixel circuit 20 connected with the second-region light-emitting element 40. For example, in a region of the auxiliary region Ra or of the first display region R1 excluding the auxiliary region Ra, a plurality of dummy pixel circuits may be provided. The dummy pixel circuit is not connected with any light-emitting element. Providing the dummy pixel circuit is favorable for improving uniformity of components of respective film layers in an etching process. For example, the dummy pixel circuit has the same structure as the second-type pixel circuit 20 in a row or a column where it is located, except that it is not connected with any light-emitting element. For example, in the first display region R1, the auxiliary region Ra and the region of the first display region R1 excluding the auxiliary region Ra (non-auxiliary region) have same pixel density, or same resolution, but it is not limited thereto.

As illustrated in FIG. 1B and FIG. 3, the plurality of the conductive lines L1 may be provided in the auxiliary region Ra and the second display region R2.

Figure 4:
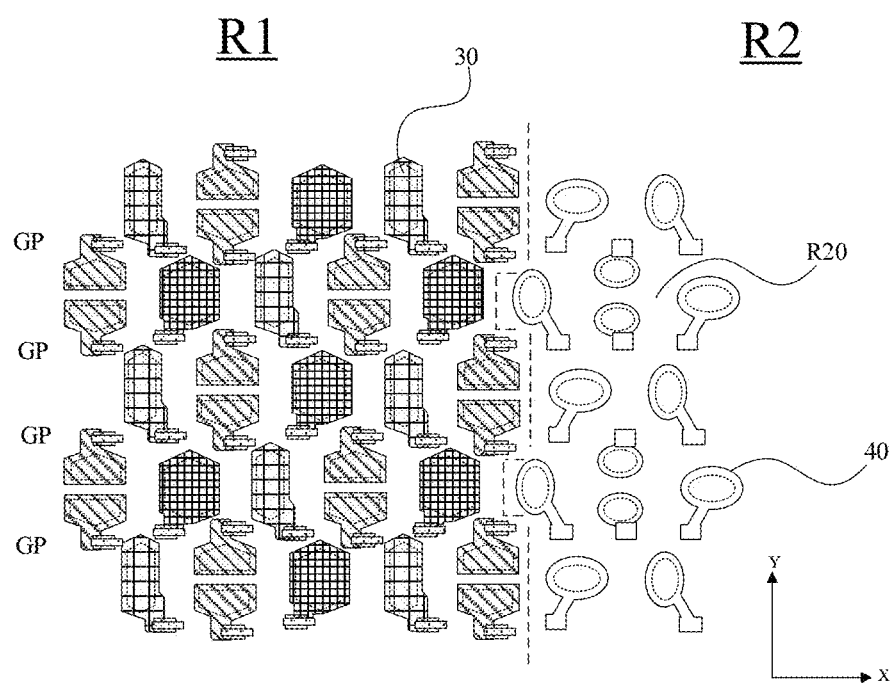
FIG. 4 is a schematic diagram of a first display region and a second display region in a display panel provided by an embodiment of the present disclosure.

FIG. 4 is a schematic diagram of a first display region and a second display region in a display panel provided by an embodiment of the present disclosure. As illustrated in FIG. 4, in the second display region R2, a light-transmitting region R20 is provided between adjacent second-region light-emitting elements 40. For example, as illustrated in FIG. 4, a plurality of light-transmitting regions R20 are connected with each other, to form a continuous light-transmitting region separated by a plurality of second-region light-emitting elements 40. The conductive line L1 is made of a transparent conductive material to increase light transmittance of the light-transmitting region R20 as much as possible. As illustrated in FIG. 4, a region of the second display region R2 except that provided with the second-region light-emitting element 40 may be a light-transmitting region.

Figure 5A:
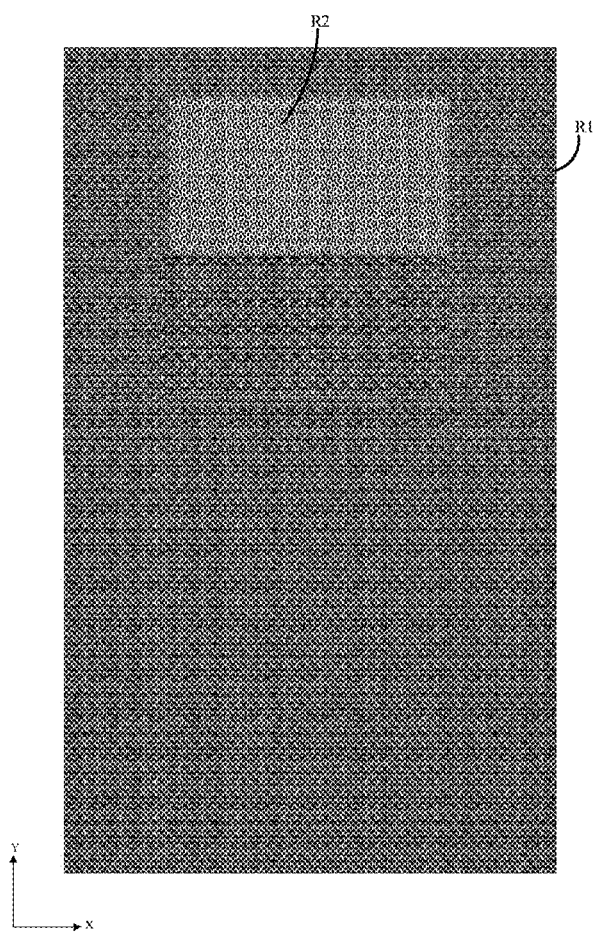
FIG. 5A to FIG. 5C are partial plan views of display panels provided by embodiments of the present disclosure.
Figure 5B:
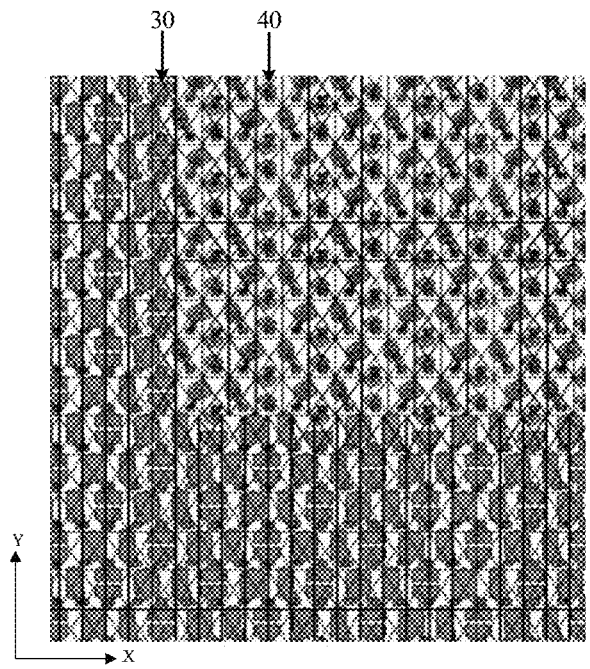
Figure 5C:
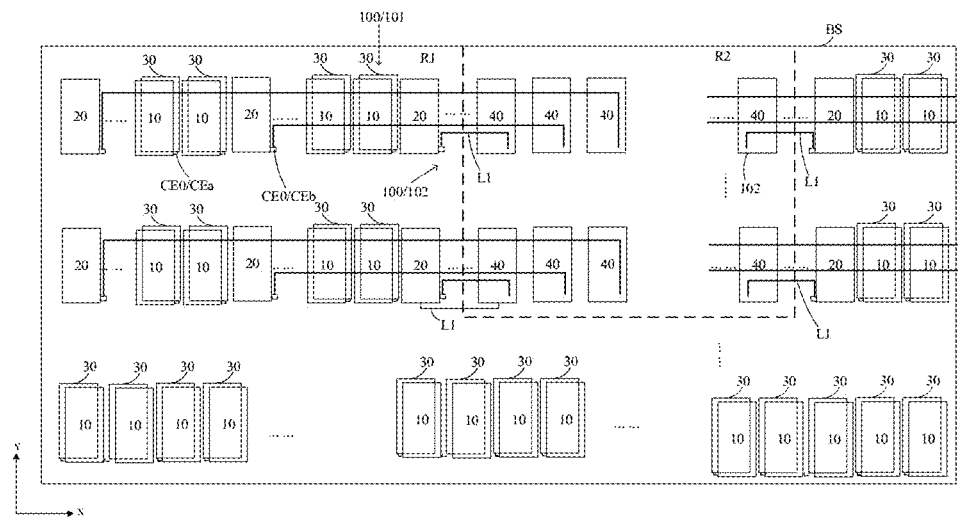

FIG. 5A to FIG. 5C are partial plan views of a display panel provided by an embodiment of the present disclosure. FIG. 5A to FIG. 5C are described below.

FIG. 5A is a schematic diagram of a first display region and a second display region of a display panel provided by an embodiment of the present disclosure. As illustrated in FIG. 5A, the second display region R2 is a light-transmitting display region; and the first display region R1 is a display region.

FIG. 5B is a schematic diagram of a first-region light-emitting element in a first display region and a second-region light-emitting element in a second display region of a display panel provided by an embodiment of the present disclosure. FIG. 5B illustrates the first-region light-emitting element 30 and the second-region light-emitting element 40.

Referring to FIG. 5A, FIG. 5B, and FIG. 3, in order to improve display effect, a density of the second-region light-emitting elements 40 may be equal to a density of the first-region light-emitting elements 30. That is, a resolution of the second display region R2 is the same as a resolution of the first display region R1. Of course, in other embodiments, the density of the second-region light-emitting elements 40 may be greater or less than the density of the first-region light-emitting elements 30. That is, the resolution of the second display region R2 may be greater or less than the resolution of the first display region R1. For example, as illustrated in FIG. 5B and FIG. 4, a light-emitting area of the second-region light-emitting element 40 is less than a light-emitting area of the first-region light-emitting element 30. That is, the light-emitting area of the first-region light-emitting element 30 is greater than the 1 light-emitting area of the second-region light-emitting element 40. FIG. 4 illustrates the light-emitting area of the second-region light-emitting element 40 and the light-emitting area of the first-region light-emitting element 30 with dotted lines. For example, the light-emitting area of the light-emitting element may correspond to an area of an opening of a pixel definition layer.

FIG. 5C illustrates the first-region light-emitting element 30, the second-region light-emitting element 40, the first-type pixel circuit 10, the second-type pixel circuit 20, a connecting element CE0, and the conductive line L1. Each pixel circuit is connected with a light-emitting element through a connecting element CE0. That is, each pixel unit has one connecting element CE0. That is, the first-type pixel circuit 10 is connected with the first-region light-emitting element 30 through a connecting element CE0 (connecting element CEa); and the second-type pixel circuit 20 is connected with the second-region light-emitting element 40 through a connecting element CE0 (connecting element CEb).

For example, as illustrated in FIG. 5C, one end of the conductive line L1 is connected with the second-region light-emitting element 40; and the other end of the conductive line L1 is connected with the second-type pixel circuit 20 through the connecting element CE0 (connecting element CEb). For example, the connecting element CE0 is connected with the pixel circuit 100a and the light-emitting element 100b, respectively. For example, the connecting element CE0 is connected with a light-emitting control transistor in the pixel circuit 100a and a first electrode of the light-emitting element 100b, respectively. For example, the connecting element CE0 may be formed by a single conductive member, or may include two different conductive members located in different layers. For example, the connecting element CE0 may include one conductive member located in one conductive layer and another conductive member located in another conductive layer.

As illustrated in FIG. 5C, a conductive line L1 passes through a region where the pixel circuit of the pixel unit is located to respectively connect the second-type pixel circuit 20 and the second-region light-emitting element 40 on both sides of the pixel unit. For example, the region where the pixel circuit of the pixel unit is located overlaps with a plurality of conductive lines L1 passing through the region. A region in the first display region R1 where the second-type pixel circuit 20 is arranged may be referred to as an auxiliary region Ra (as illustrated in FIG. 1B and FIG. 3); and the auxiliary region Ra may also be referred to as a transition region. FIG. 5C is described by taking that one first-type pixel circuit 10 overlaps with two conductive lines L1 at most as an example; in other embodiments, one first-type pixel circuit 10 may also overlap with more conductive lines L1. For example, in some embodiments, one first-type pixel circuit 10 may overlap with 5 to 15 conductive lines L1. The number of conductive lines L1 overlapping with one first-type pixel circuit 10 may be determined as needed. As illustrated in FIG. 5C, the second-type pixel circuit 20 may also overlap with the conductive line L1 that is not connected therewith.

In some embodiments, a pitch of the first-type pixel circuit 10 may be compressed in a first direction X to obtain a region where the second-type pixel circuit 20 is provided. For example, as illustrated in FIG. 5C, in the auxiliary region, a column of second-type pixel circuits 20 is arranged every other predetermined column of first-type pixel circuits 10. For example, the number of columns of first-type pixel circuits 10 between two adjacent columns of second-type pixel circuits 20 may be determined as needed.

For example, in some embodiments, a pitch of the first-type pixel circuit 10 may be reduced in a first direction X to obtain a region where the second-type pixel circuit 20 is provided. For example, the pitch of the first-type pixel circuit 10 in the first direction X is less than a pitch of the first-region light-emitting element 30 in the first direction X. The first direction X is, for example, but is not limited to, a row direction. In other embodiments, the first direction X may also be a column direction. The embodiments of the present disclosure is described by taking the first direction X as a row direction as an example.

Some figures illustrate a third direction Z, which is perpendicular to a main surface of the base substrate. The main surface of the base substrate is a surface on which various components are formed. An upper surface of the base substrate in the sectional view is the main surface of the base substrate. The first direction X and the second direction Y are both parallel to the main surface of the base substrate. For example, the first direction X intersects with the second direction Y. For further example, the first direction X is perpendicular to the second direction Y.

Figure 5D:
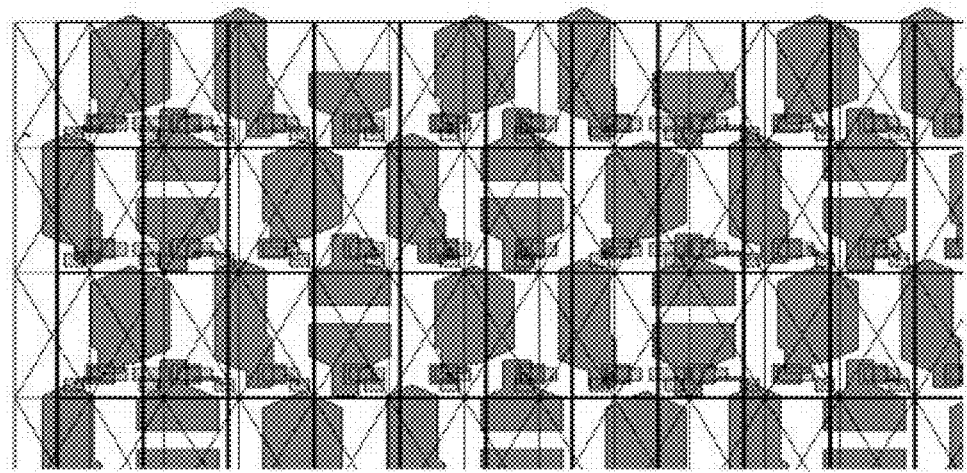
FIG. 5D to FIG. 5F are schematic structural diagrams of display panels provided by some embodiments of the present disclosure.
Figure 5E:
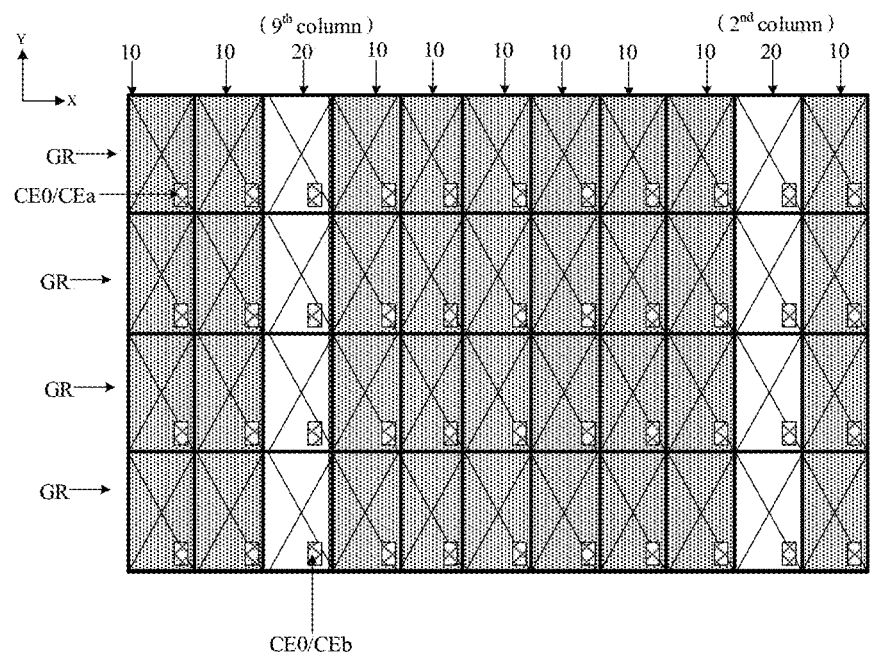
Figure 5F:
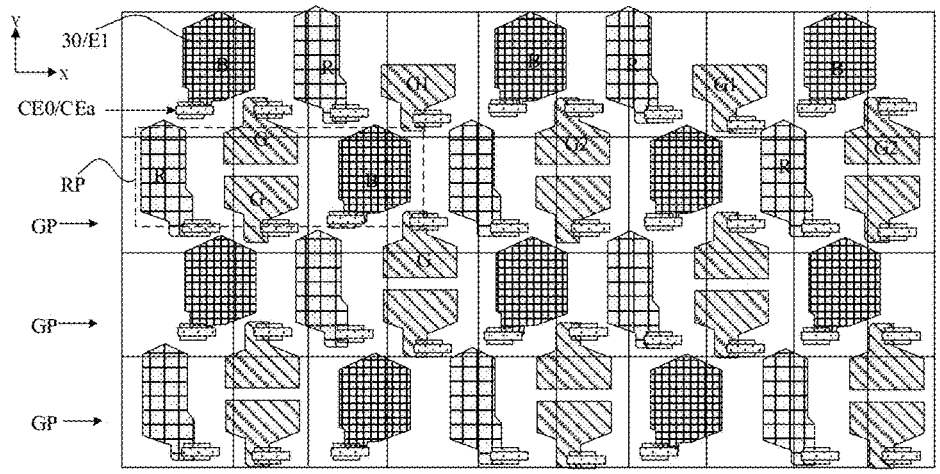

FIG. 5D to FIG. 5F are schematic structural diagrams of display panels provided by some embodiments of the present disclosure. In order to further illustrate that there are a plurality of extra columns of pixel circuits after the pixel circuit is compressed, FIG. 5D illustrates a schematic diagram illustrating a structure of a first-region light-emitting element of a first display region R1. FIG. 5E illustrates a schematic diagram of a portion of the structure (including only the pixel circuit) in FIG. 5A; and FIG. 5F illustrates a schematic diagram of a portion of the structure (including only the light-emitting element) in FIG. 5A.

Referring to FIG. 5D to FIG. 5F, a width of the pixel circuit is less than a width of the light-emitting element. In this way, pixel circuits in the $2^{nd}$ column and the $9^{th}$ column from right to left are not connected with any first-region light-emitting element, which belong to the extra columns of pixel circuits, and may be used as the second-type pixel circuits 20 for connecting the second-region light-emitting elements 40 in the second display region R2. For example, as illustrated in FIG. 5F, the first-region light-emitting elements 30 may include first electrodes E1 of 4 types of light-emitting elements RG1BG2; and the first electrode E1 of the light-emitting element is connected with the first-type pixel circuit 10 through a connecting element CE0 (the connecting element CEa). R refers to a light-emitting element emitting red light, G1 refers to a light-emitting element emitting green light, B refers to a light-emitting element emitting blue light, and G2 refers to a light-emitting element emitting green light. For example, in order to provide sufficient space for arranging the conductive line L1, axes of the connecting electrodes CE0 in the same row of pixel units may be located in a straight line.

FIG. 5F illustrates four rows of connecting elements CE0, that is, FIG. 5F illustrates four rows of light-emitting elements. For example, light-emitting elements in each row are sequentially arranged in the first direction X in a manner of RGBG or BGRG. Of course, light-emitting colors of the light-emitting elements are not limited to RGB; arrangement mode of the light-emitting elements is not limited to that illustrated in FIG. 5F; and the embodiments of the present disclosure is described by taking that the light-emitting element includes RGBG as an example. For example, as illustrated in FIG. 5F, G includes G1 or G2. For example, in the pixel arrangement illustrated in FIG. 5F, one repeating unit RP includes two Gs arranged in a second direction Y and R and B respectively arranged on both sides of the two Gs in the first direction X, R and G constitute a pixel, and borrow B from another repeating unit adjacent thereto to constitute a virtual pixel for display; B and G constitute a pixel, and borrow R from another repeating unit adjacent thereto to constitute a virtual pixel for display, but it is not limited thereto.

Figure 6A:
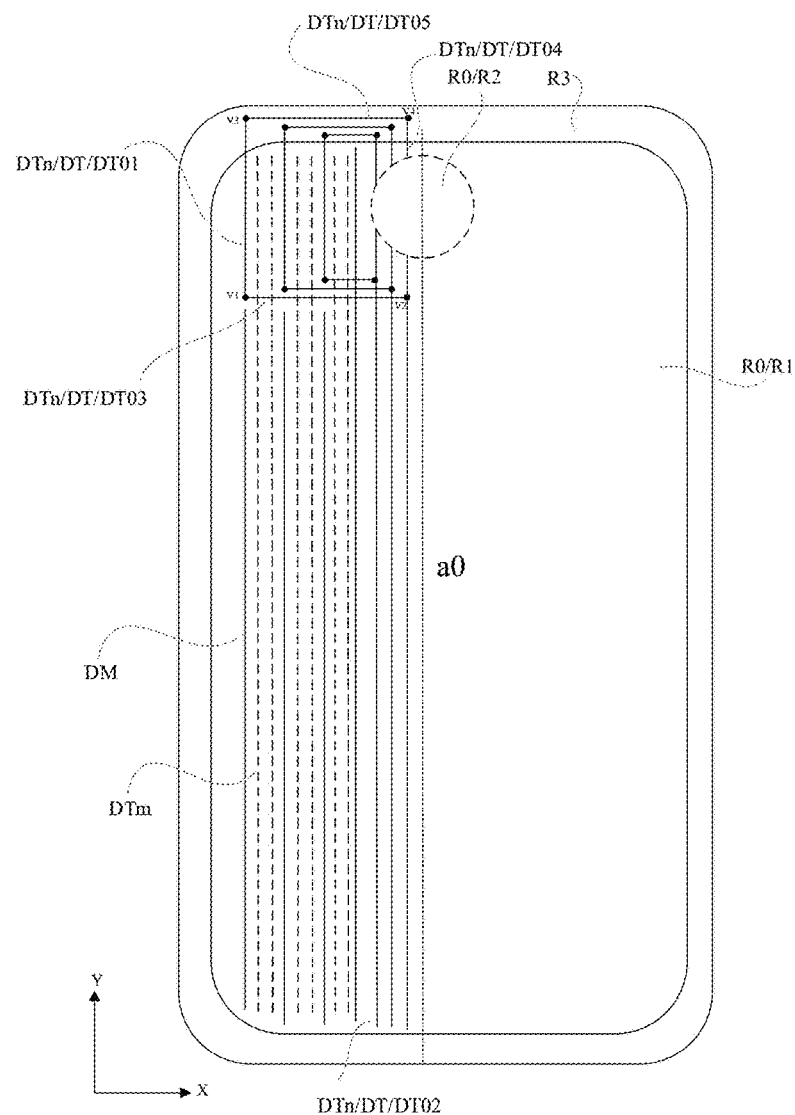
FIG. 6A is a schematic diagram of a data line in a display panel.
Figure 6B:
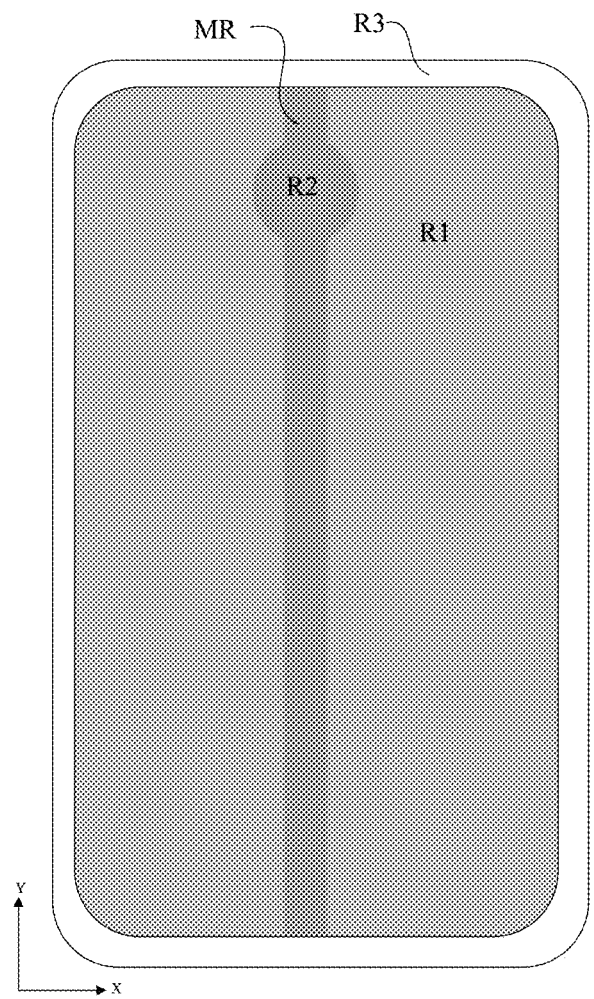
FIG. 6B is a schematic diagram of a display panel with a display defect.
Figure 6C:
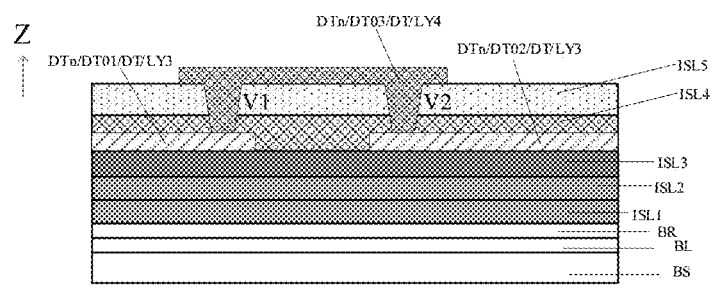
FIG. 6C is a schematic cross-sectional view of a data line formed by segments at a position from via hole V1 to via hole V2 in a display panel.
Figure 6D:
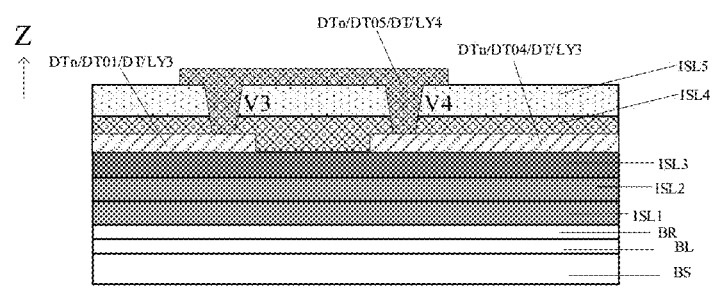
FIG. 6D is a schematic cross-sectional view of a data line formed by segments at a position from via hole V3 to via hole V4 in a display panel.
Figure 6E:
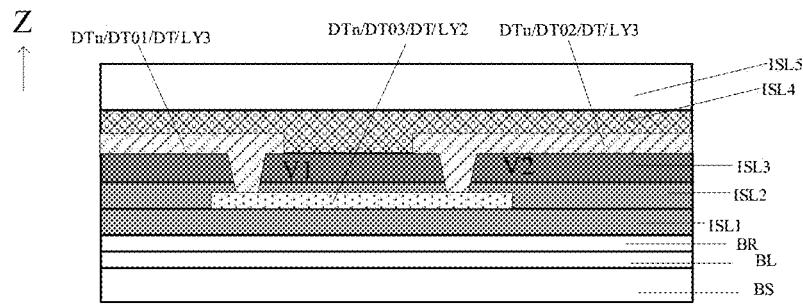
FIG. 6E is a schematic cross-sectional view of a data line formed by segments at a position from via hole V1 to via hole V2 in a display panel.

FIG. 6A is a schematic diagram of a data line in a display panel. FIG. 6B is a schematic diagram of a display panel with a display defect. FIG. 6C is a schematic cross-sectional view of a data line formed by segments at a position from via hole V1 to via hole V2 in a display panel. FIG. 6D is a schematic cross-sectional view of a data line formed by segments at a position from via hole V3 to via hole V4 in a display panel. FIG. 6E is a schematic cross-sectional view of a data line formed by segments at a position from via hole V1 to via hole V2 in a display panel.

As illustrated in FIG. 6A, the second display region R2 is a light-transmitting display region. As illustrated in FIG. 3 and FIG. 6A, the second-type pixel circuit 20 is separated from the second-region light-emitting element 40, the second-type pixel circuit 20 is provided in the first display region R1, and a data line of the second pixel unit 102 is formed in segments. That is, as illustrated in FIG. 6A, a data line DTn includes a first portion DT01, a second portion DT02, and a third portion DT03. As illustrated in FIG. 6A, both the first portion DT01 and the second portion DT02 extend in the second direction Y, the third portion DT03 extends in the first direction X, and the first portion DT01 is connected with the second portion DT02 by the third portion DT03. Because the data line DTn includes a vertical portion and a horizontal portion, a length of the data line DTn is larger than a length of a data line DTm that only includes a vertical portion, a resistance of the data line DTn is greater than a resistance of the data line DTm, a capacitance on the data line DTn is greater than a capacitance on the data line DTm, thus a load on the data line DTn is greater than a load on the data line DTm; therefore, as illustrated in FIG. 6B, display defects of dark vertical stripes occur on the display panel. FIG. 6B illustrates a dark vertical stripe MR. In an embodiment of the present disclosure, the data line can be divided into the data line DTm and the data line DTn. The data line DTm can be referred to as a first-type data line DTm, and the data line DTn can be referred to as a second-type data line DTn. For example, the first-type data line DTm extends in the second direction Y, and the second-type data line DTn includes a portion extending in the first direction X and a portion extending in the second direction Y. For example, in an embodiment of the present disclosure, the first direction X is the row direction of the pixel unit, and the second direction Y is the column direction of the pixel unit, but not limited to this. For the sake of clarity, FIG. 6A illustrates only three second-type data lines DTn. The display panel can be provided with a plurality of second-type data lines DTn, to form a plurality of third portions DT03, which are arranged near the second display region R2.

As illustrated in FIG. 6A, in the display panel provided by some embodiments of the present disclosure, the second display region R2 is surrounded by the first display region R1.

FIG. 6A illustrates a centerline a0 of the display panel. For example, the display panel is arranged symmetrically with respect to the centerline a0. For example, the centerline a0 is parallel to the second direction Y. For example, the second display region R2 of the display panel is arranged symmetrically with respect to the centerline a0. For example, the first display region R1 of the display panel is arranged symmetrically with respect to the centerline a0.

As illustrated in FIG. 6C, the display panel includes a base substrate BS and various structures located on the base substrate BS. As illustrated in FIG. 6C, a buffer layer BL is arranged on the base substrate BS, an isolation layer BR is arranged on the buffer layer BL, an insulating layer ISL1, an insulating layer ISL2, and an insulating layer ISL3 are arranged on the isolation layer BR, the first portion DT01 and the second portion DT02 of the second-type data line DTn are arranged on the insulating layer ISL3, and an insulating layer ISL4 and an insulating layer ISL5 are arranged on the first portion DT01 and the second portion DT02 of the second-type data line DTn, the third portion DT03 of the second-type data line DTn is arranged on the insulating layer ISL5. As illustrated in FIG. 6C, the third portion DT03 of the second-type data line DTn is arranged in the conductive pattern layer LY4, and the first portion DT01 and the second portion DT02 of the second-type data line DTn are arranged in the conductive pattern layer LY3.

As illustrated in FIG. 6C, the third portion DT03 is connected with the first portion DT01 through a via hole V1 penetrating the insulating layer ISL4 and the insulating layer ISL5, and the third portion DT03 is connected with the second portion DT02 through a via hole V2 penetrating the insulating layer ISL4 and the insulating layer ISL5.

As illustrated in FIG. 6A and FIG. 6D, the second-type data line DTn further includes a fourth portion DT04 and a fifth portion DT05. The fourth portion DT04 extends in the second direction Y, the fifth portion DT05 extends in the first direction X, and the first portion DT01 is connected with the fourth portion DT04 through the fifth portion DT05. For example, in some embodiments, the first portion DT01 and the fourth portion DT04 are in the same layer, and the fifth portion DT05 is not in the same layer as the first portion DT01 and the fourth portion DT04.

As illustrated in FIG. 6D, the fifth portion DT05 is connected with the first portion DT01 through a via hole V3 penetrating the insulating layer ISL4 and the insulating layer ISL5, and the fifth portion DT05 is connected with the fourth portion DT04 through a via hole V4 penetrating the insulating layer ISL4 and the insulating layer ISL5.

It should be noted that the embodiments of the present disclosure is described by taking that the second-type data line DTn includes the first portion DT01, the second portion DT02, the third portion DT03, the fourth portion DT04, and the fifth portion DT05 as an example. Of course, in some embodiments, the second-type data line DTn may not have the fourth portion DT04 and the fifth portion DT05. Portions included by the second-type data line DTn can be determined as needed.

As illustrated in FIG. 6A, the display panel includes a peripheral region R3, the fifth portion DT05 is located in the peripheral region R3, and the fourth portion DT04 extends from a display region R0 to the peripheral region R3. As illustrated in FIG. 6A, the first portion DT01 extends from the display region R0 to the peripheral region R3. As illustrated in FIG. 6A, the fourth portion DT04 and the second portion DT02 are arranged on opposite sides of the second display region R2, respectively. As illustrated in FIG. 6A, the fourth portion DT04 is located on an upper side of the second display region R2, and the second portion DT02 is located on a lower side of the second display region R2.

As illustrated in FIG. 6A, a plurality of first-type data lines DTm and first portions DT01 of a plurality of second-type data lines DTn are arranged at intervals. The number of the first-type data lines DTm between two adjacent first portions DT01 is not limited to that as illustrated in FIG. 6A, and can be arranged as required. As illustrated in FIG. 6A, the second portions DT02 of the plurality of second-type data lines DTn are arranged in the first direction X. As illustrated in FIG. 6A, the fourth portions DT04 of the plurality of second-type data lines DTn are arranged in the first direction X.

A layer in which each portion of the second-type data line DTn is located can be arranged as needed, as long as two portions connected through a via hole are located in different layers. For example, for respective portions of the second-type data line DTn, two portions extending in different directions are located in different layers. Of course, other manners can also be adopted. Each of the first portion DT01 to the fifth portion DT05 illustrated in the figure can further include sub-portions at different layers.

FIG. 6A illustrates three second-type data line DTn and six first-type data lines DTm. It should be noted that the number of the second-type data lines DTn and the number of the first-type data lines DTm can be determined as needed.

For example, referring to FIG. 2, FIG. 3, FIG. 5C, and FIG. 6A, at least one embodiment of the present disclosure provides a display panel, the display panel includes: a base substrate BS, a pixel unit 100, and a data line DT. The pixel unit 100 is located on the base substrate BS, and includes a pixel circuit 100a and a light-emitting element 100b, the pixel circuit 100a is configured to drive the light-emitting element 100b to make the light-emitting element 100b emit light, the data line DT is configured to provide a data voltage to the pixel circuit, so that the pixel unit can display different grayscales, thereby realizing image display. For example, the data line DT includes a plurality of first-type data lines DTm and a plurality of second-type data lines DTn, the plurality of first-type data lines DTm are arranged in the first direction X, the first-type data line DTm extends in the second direction Y, the first direction X intersects with the second direction Y, the second-type data line DTn includes a first portion DT01, a second portion DT02, and a third portion DT03, the first portion DT01 is connected with the second portion DT02 by the third portion DT03, the first portion DT01 and the second portion DT02 both extend in the second direction Y, and the third portion DT03 extends in the first direction X. For example, the third portion DT03 is located in the first display region R1.

In the embodiments of the present disclosure, a component extending in one direction refers to an overall trend of the component, does not require portions in all positions of the component to extend in this direction, may have a portion extending in a different direction, and an extension direction of a component refers to an extension trend of the component as a whole.

For example, the pixel circuit 100a includes a driving transistor and a data writing transistor, the driving transistor is connected with the data writing transistor; the data line DT is connected with the data writing transistor.

As illustrated in FIG. 6C, the third portion DT03 and the second portion DT02 are located in different layers, the third portion DT03 and the first portion DT01 are located in different layers, the first portion DT01 is closer to the base substrate BS than the third portion DT03, and, the second portion DT02 is closer to the base substrate BS than the third portion DT03.

As illustrated in FIG. 6C, one end of the third portion DT03 is connected with the first portion DT01 through the via hole V1 penetrating the insulating layer ISL4 and the insulating layer ISL5, and the other end of the third portion DT03 is connected with the second portion DT02 through the via hole V2 penetrating the insulating layer ISL4 and the insulating layer ISL5.

As illustrated in FIG. 6E, the third portion DT03 is arranged in a conductive pattern layer LY2, the third portion DT03 is closer to the base substrate BS than the first portion DT01 and is closer to the base substrate BS than the second portion DT02.

Embodiments of the present disclosure are described by taking that an insulating layer ISL4 and an insulating layer ISL5 are provided between the conductive pattern layer LY4 and the conductive pattern layer LY3 as an example, but not limited to this, only one insulating layer may be provided between the conductive pattern layer LY4 and the conductive pattern layer LY3. For example, only the insulating layer ISL5 is provided between the conductive pattern layer LY4 and the conductive pattern layer LY3. For example, the insulating layer ISL5 is a planarization layer. The insulating layer ISL4 can be a passivation layer.

For example, illustrated in FIG. 6C, in an embodiment of the present disclosure, a thickness of the insulating layer ISL5 is greater than a thickness of at least one of the insulating layer ISL4, the insulating layer ISL3, the insulating layer ISL2, and the insulating layer ISL1. In some embodiments, the thickness of the insulating layer ISL5 is greater than the thickness of every one of the insulating layer ISL4, the insulating layer ISL3, the insulating layer ISL2, and the insulating layer ISL1. For example, the buffer layer BL, the isolation layer BR, the insulating layer ISL1, the insulating layer ISL2, the insulating layer ISL3, the insulating layer ISL4, and the insulating layer ISL5 are all made of insulating materials. At least one of the buffer layer BL, the isolation layer BR, the insulating layer ISL1, the insulating layer ISL2, the insulating layer ISL3, and the insulating layer ISL4 is made of an inorganic insulating material, and the insulating layer ISL5 can be made of an organic material. For example, the inorganic insulating material includes at least one of silicon oxide, silicon nitride, and silicon oxynitride, but not limited to this. For example, the organic material include, but are not limited to, a resin.

Compared with the display panel illustrated in FIG. 6D, in the display panel illustrated in FIG. 6C, the third portion DT03 of the second-type data line DTn is arranged in the conductive pattern layer LY4. The third portion DT03 is arranged from the conductive pattern layer LY2 to the conductive pattern layer LY4, which is conducive to alleviating a display defect of dark stripes caused by a load on the second-type data line DTn being greater than a load on the first-type data line DTm, improving display uniformity and improving display quality. For example, a sheet resistance of a material of the conductive pattern layer LY4 is smaller than a sheet resistance of a material of the conductive pattern layer LY2.

For example, the embodiments of the present disclosure other than FIG. 6E are described by taking that the third portion DT03 is arranged in the conductive pattern layer LY4 as an example.

Figure 7:
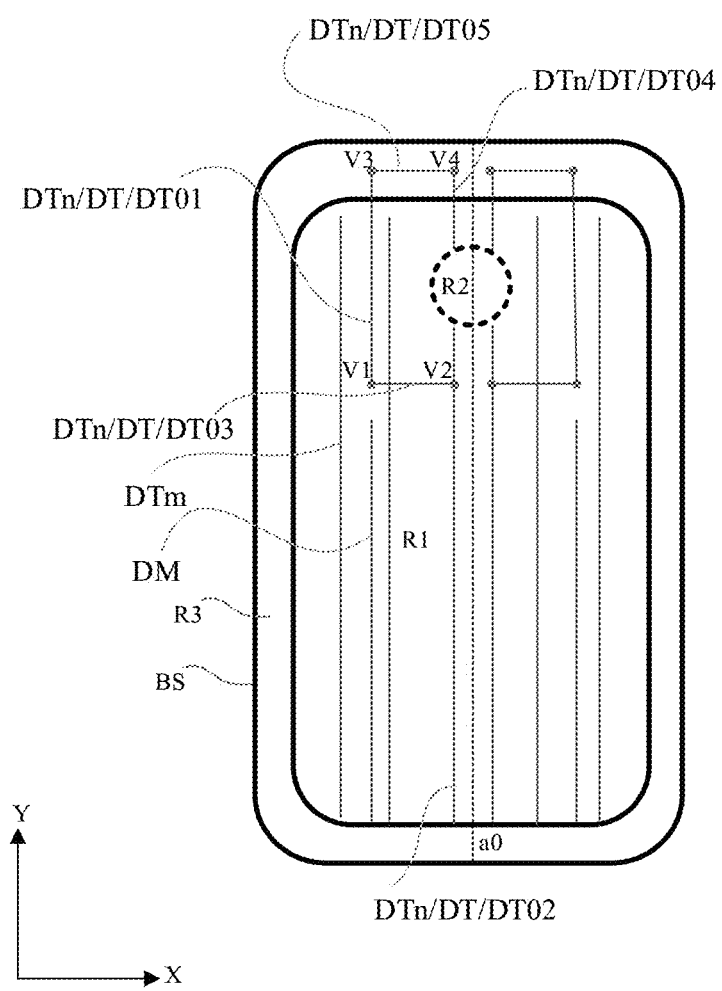
FIG. 7 is a schematic diagram illustrating a connection of different portions of a data line in a display panel.
Figure 8:
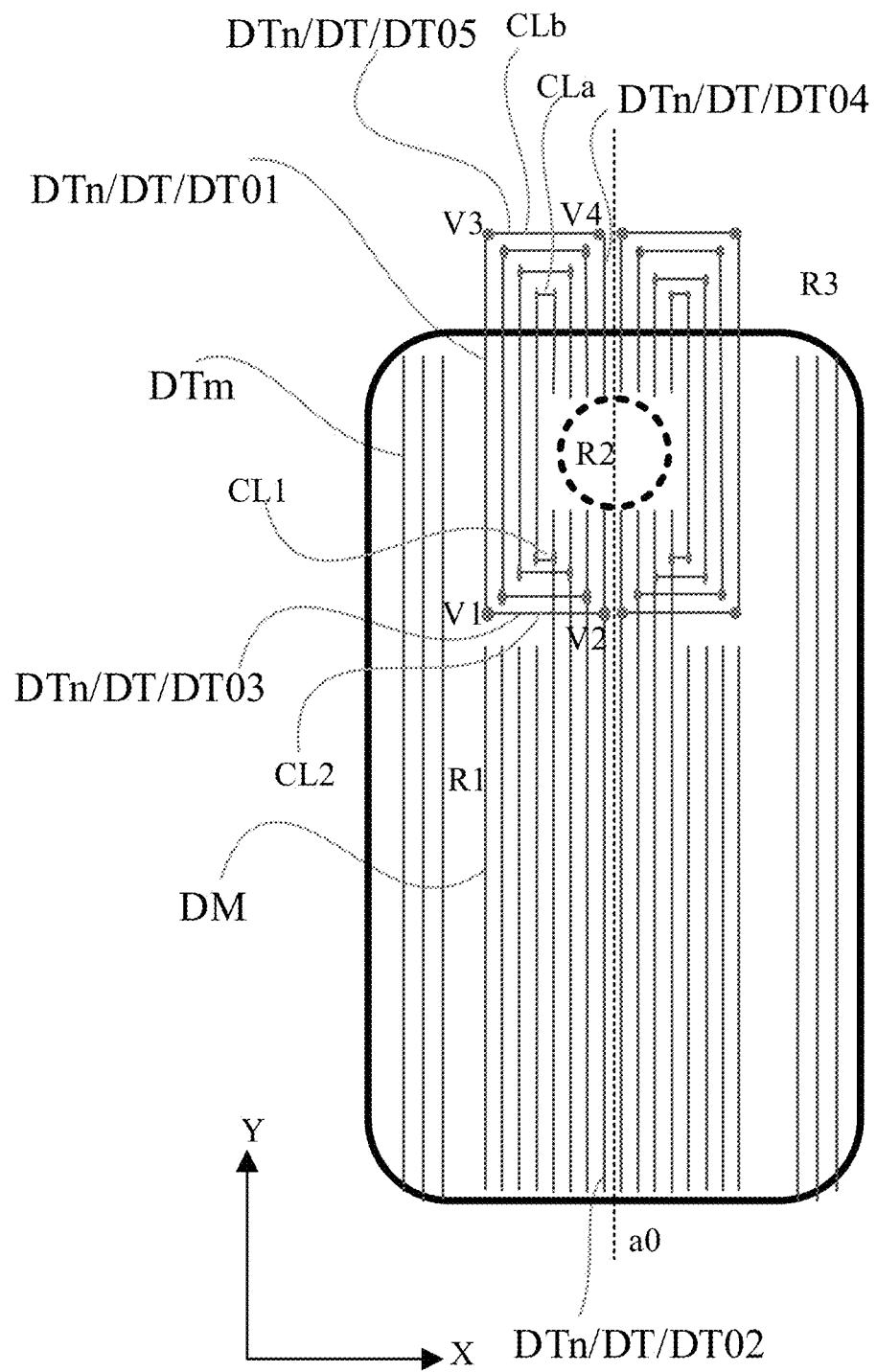
FIG. 8 is a schematic diagram illustrating a connection of different portions of a data line in a display panel.
Figure 9:
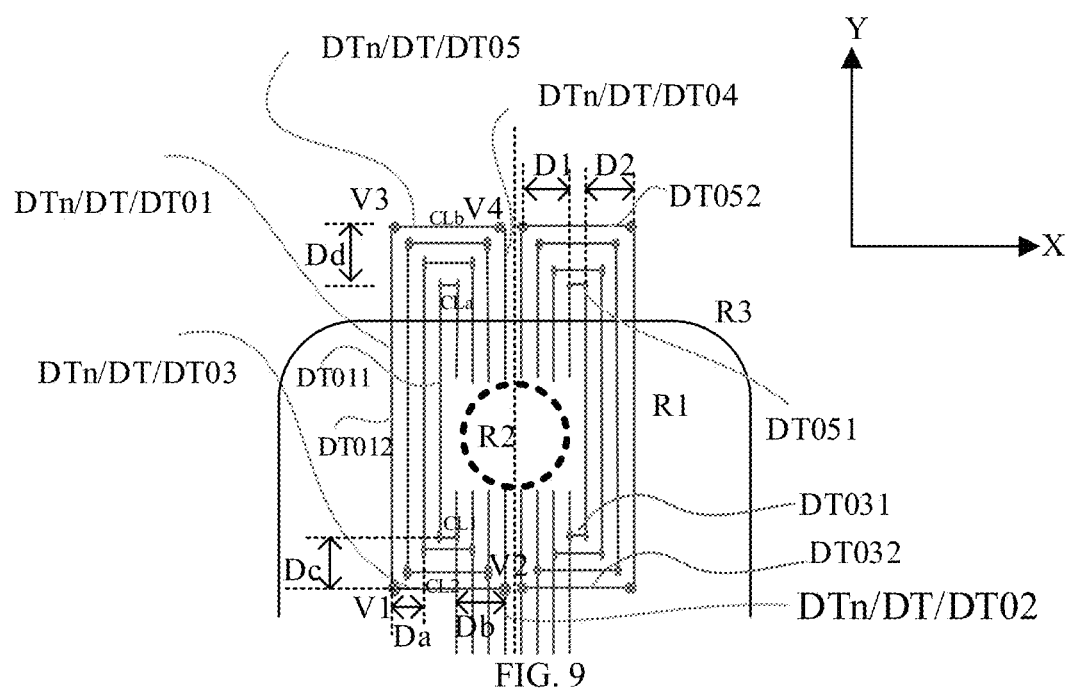
FIG. 9 is a schematic diagram of partial structure in FIG. 8.

FIG. 7 is a schematic diagram illustrating a connection of different portions of a data line in a display panel. FIG. 8 is a schematic diagram illustrating a connection of different portions of a data line in a display panel. FIG. 9 is a schematic diagram of partial structure in FIG. 8.

As illustrated in FIG. 7 and FIG. 8, for each second-type data line DTn, the second portion DT02, the third portion DT03, the first portion DT01, the fifth portion DT05, and the fourth portion DT04 are connected sequentially.

As illustrated in FIG. 7 and FIG. 8, the plurality of second-type data lines DTn are arranged symmetrically with respect to the centerline a0.

As illustrated in FIG. 6A, FIG. 7 and FIG. 8, the length of the second-type data line DTn is greater than the length of the first-type of data line DTm; therefore, the load on the second-type data line DTn is greater than the load on the first-type data line DTm.

As illustrated in FIG. 9, because the fourth portion DT04 is connected with the second portion DT02 by the fifth portion DT05, the first portion DT01, and the third portion DT03, so that a signal on the data line can be transmitted to the fourth portion DT04. Because positions of via holes of different data lines (connection holes, including via hole V1, via hole V2, via hole V3, and via hole V4) are different, thereby for different second-type of data lines DTn, lengths of the required third portions DT03 are different, and lengths of the required fifth portions DT05 are different; therefore, lengths of the data lines (the second-type data line DTn) that provides data voltage for the light-emitting elements of the second display region R2 are different, and the resistances of the second-type data lines DTn are different, and the capacitances on the second-type data lines DTn are different.

As illustrated in FIG. 9, a plurality of third portions DT03 include a third portion DT031 with the smallest length and a third portion DT032 with the largest length, a length difference of the third portion DT031 with the smallest length and the third portion DT032 with the largest length is the sum of length Da and length Db.

As illustrated in FIG. 9, a plurality of fifth portions DT05 include a fifth portion DT051 with the smallest length and a fifth portion DT052 with the largest length, a length difference of the fifth portion DT051 with the smallest length and the fifth portion DT052 with the largest length is the sum of length D1 and length D2.

As illustrated in FIG. 9, a plurality of first portions DT01 include a first portion DT011 with the smallest length and a first portion DT012 with the largest length, a length difference of the first portion DT011 with the smallest length and the first portion DT012 with the largest length is the sum of length Dc and length Dd.

For example, taking that 40 second-type data lines DTn are arranged on a left side or a right side of the centerline a0 as an example, the shortest second-type data line DTn has a resistance of 3943 Ω, the longest second-type data line DTn has a resistance of 4210 Ω, a resistance difference is 6%, and the shortest second-type data line DTn has a capacitance of 15.96 fF, the longest second-type data line DTn has a capacitance of 212.8 fF, a capacitance difference is 90%, which is easy to generate signal output difference. Because lengths of the second-type data lines DTn are different, the display defects of dark vertical stripes are easy to occur; therefore, lengths of the plurality of the second-type data lines DTn are not equal, which results in large differences in resistance and large differences in capacitance of different second-type data lines DTn, and further results in that display of the pixel unit connected with the second-type data line DTn is dark, and the display of the display panel is uneven.

Figure 10:
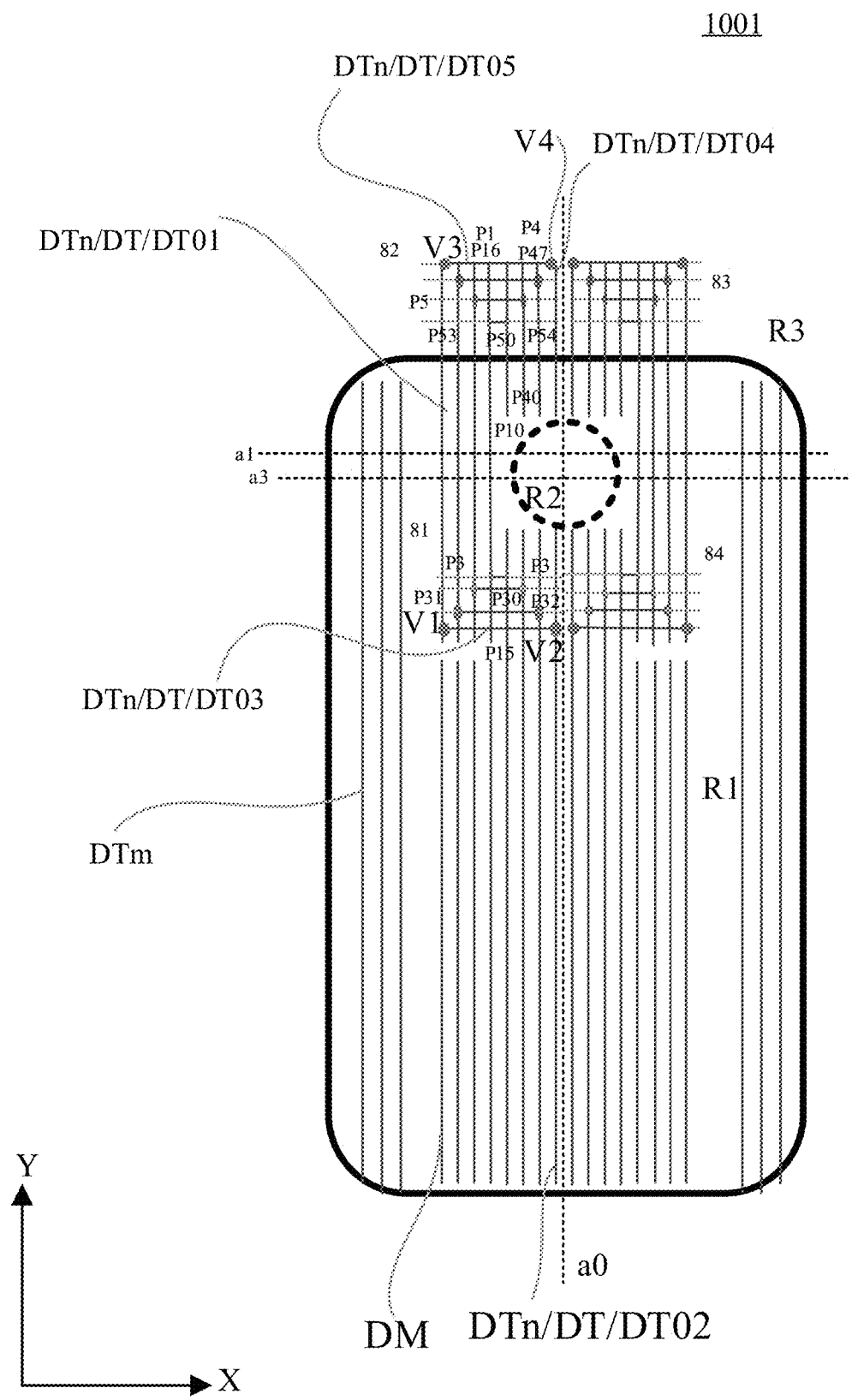
FIG. 10 is a schematic diagram of a display panel provided by an embodiment of the present disclosure.
Figure 11:
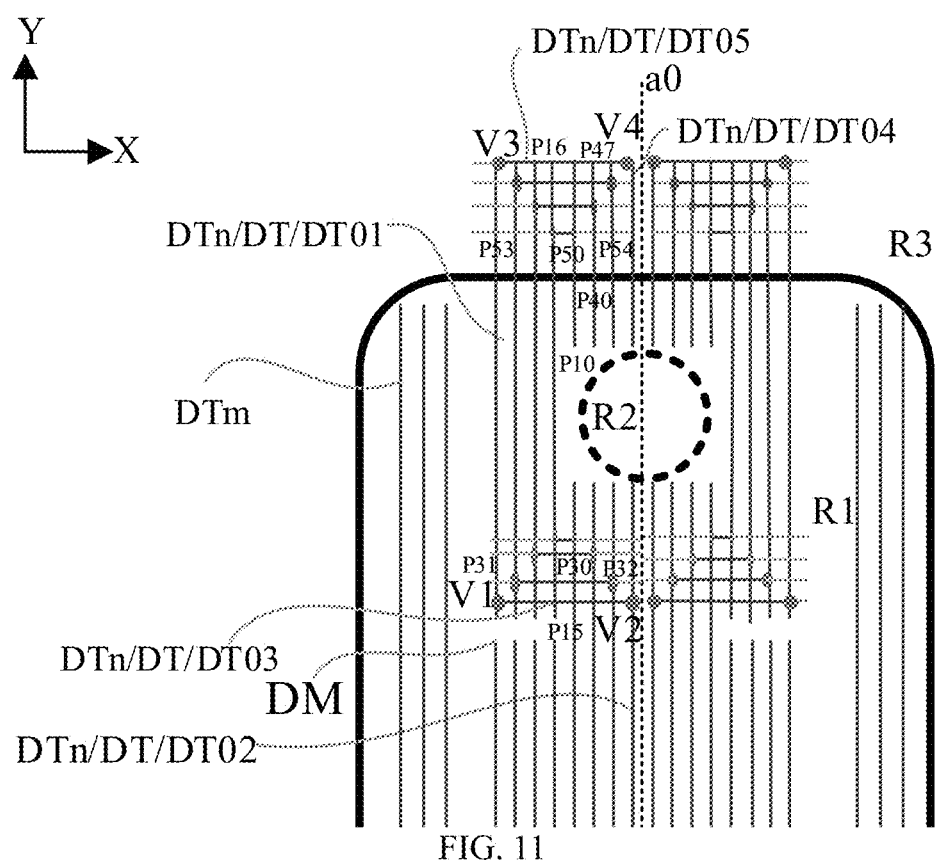
FIG. 11 is a schematic diagram of partial structure in FIG. 10.
Figure 12:
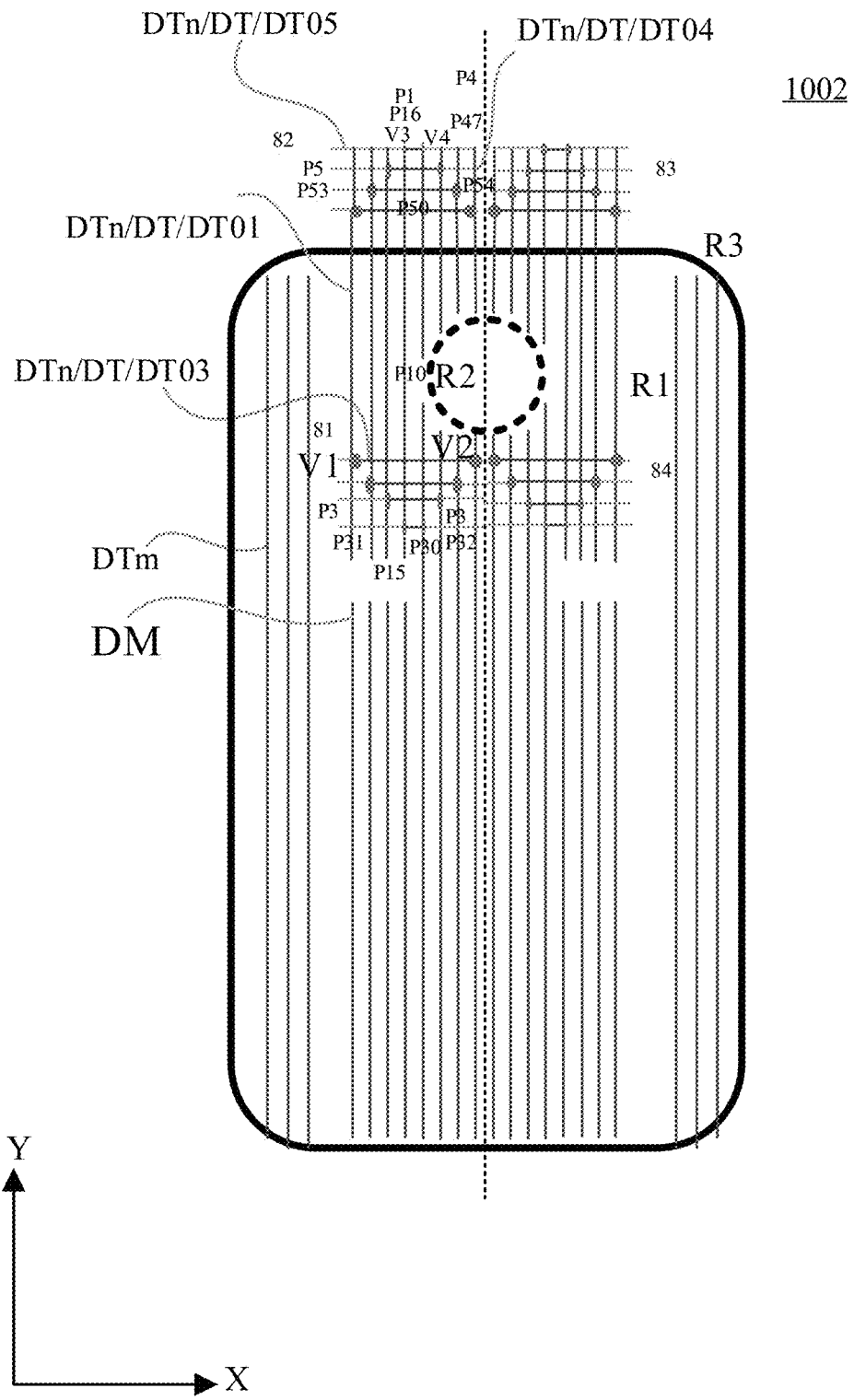
FIG. 12 is a schematic diagram of a display panel provided by an embodiment of the present disclosure.
Figure 13:
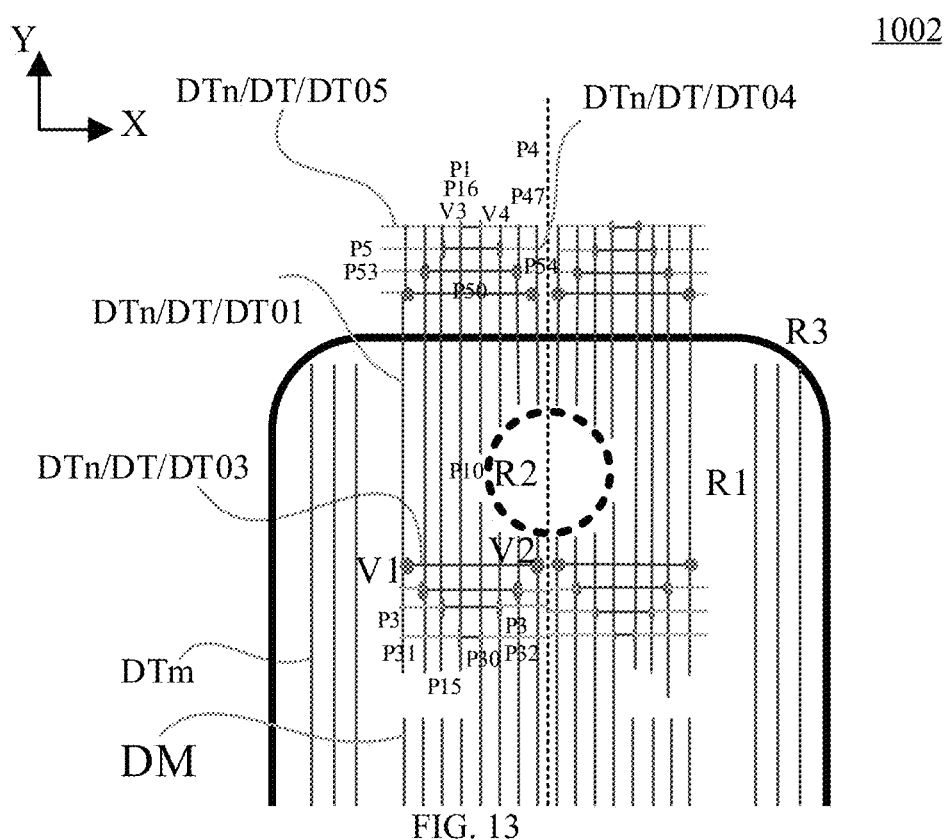
FIG. 13 is a schematic diagram of partial structure in FIG. 12.
Figure 14:
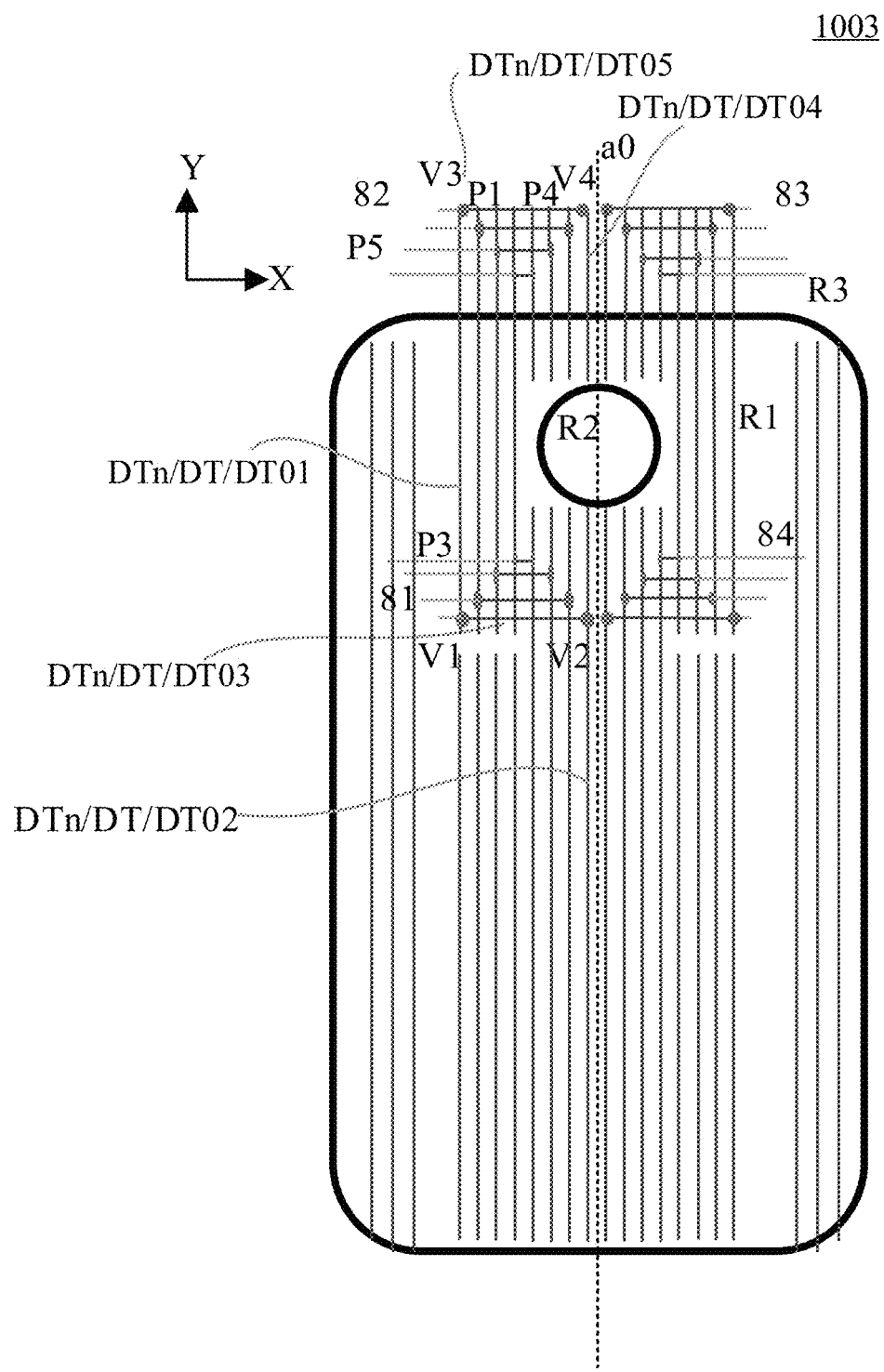
FIG. 14 is a schematic diagram of a display panel provided by an embodiment of the present disclosure.
Figure 15:
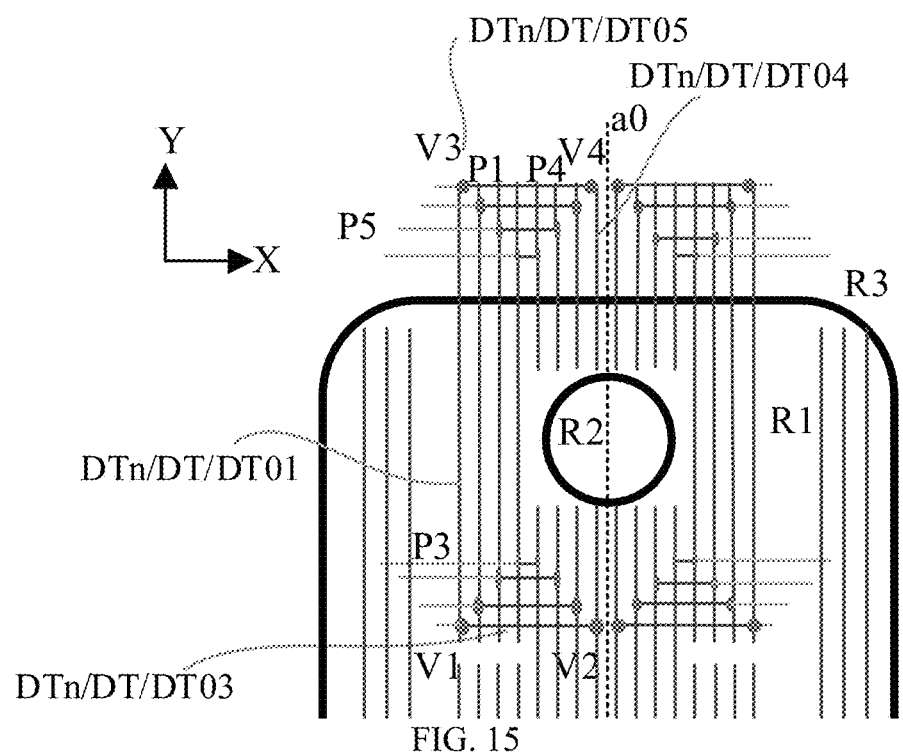
FIG. 15 is a schematic diagram of partial structure in FIG. 14.
Figure 16:
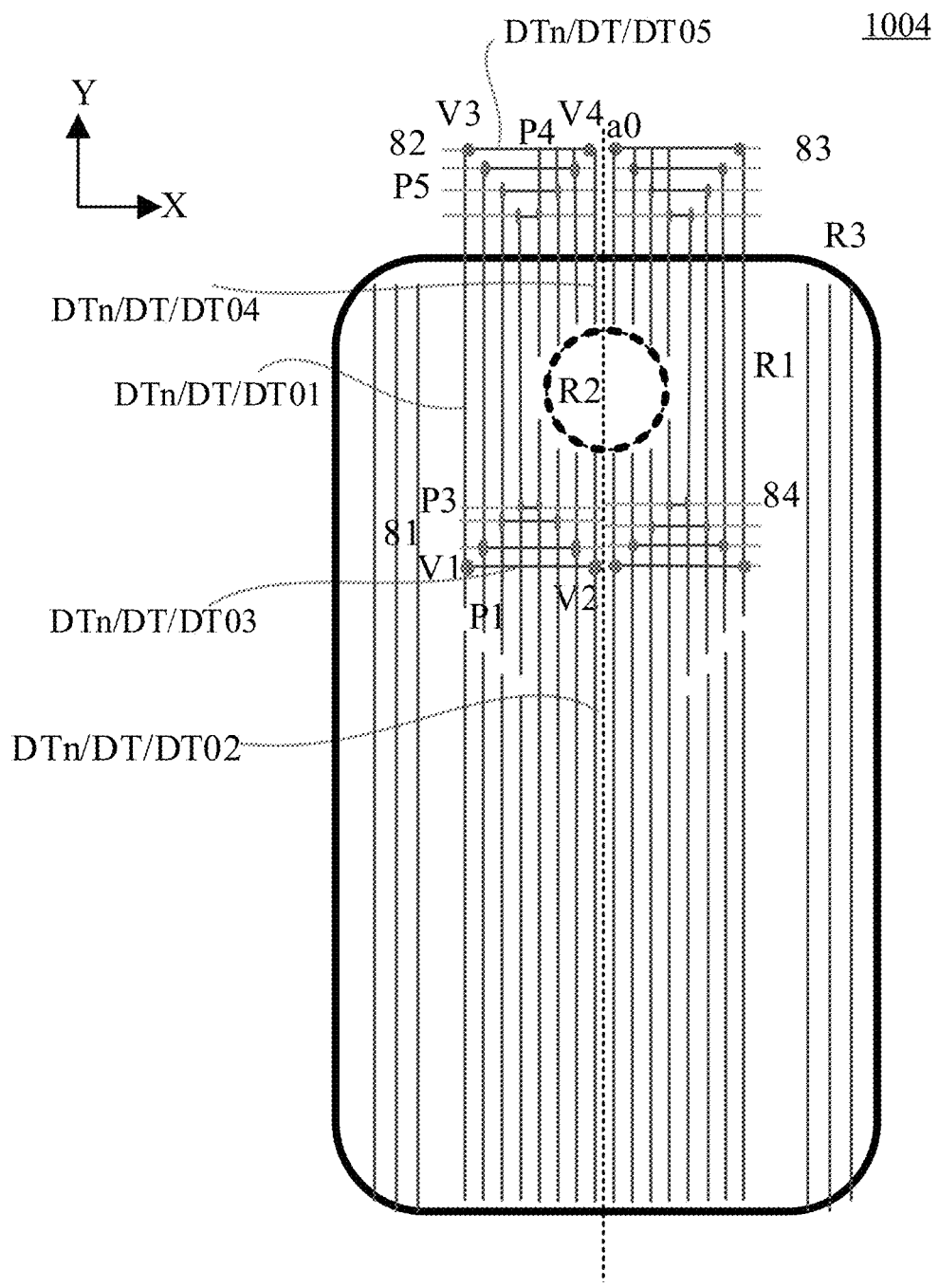
FIG. 16 is a schematic diagram of a display panel provided by an embodiment of the present disclosure.
Figure 17:
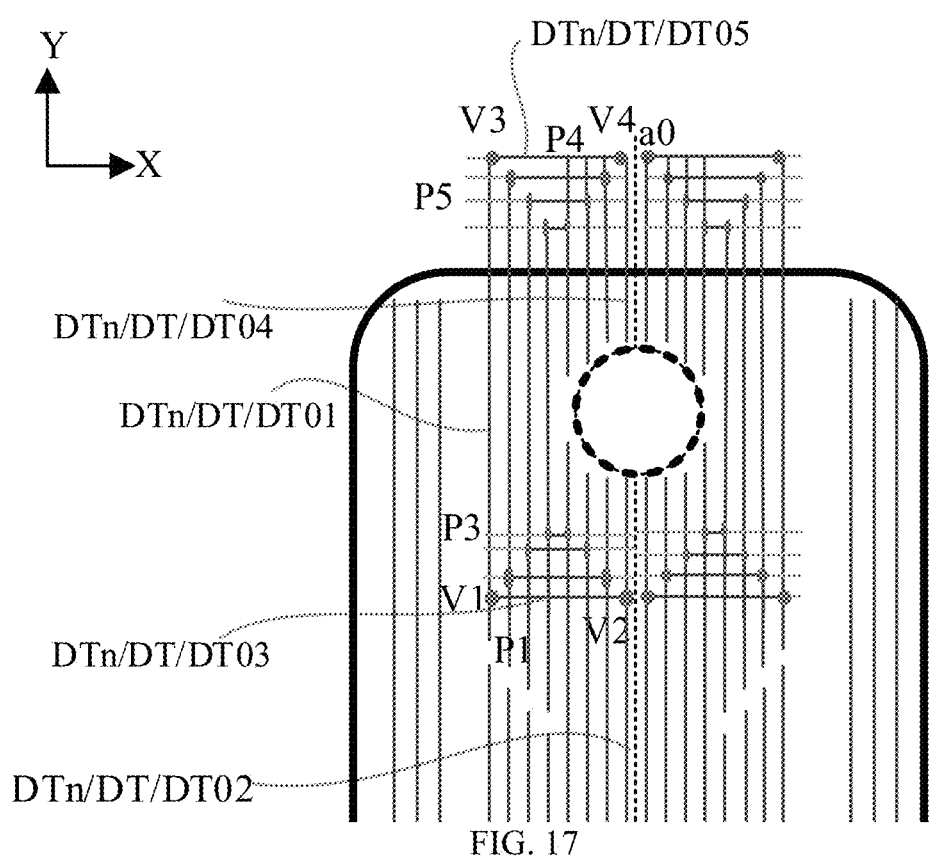
FIG. 17 is a schematic diagram of partial structure in FIG. 16.

FIG. 10 is a schematic diagram of a display panel provided by an embodiment of the present disclosure. FIG. 11 is a schematic diagram of partial structure in FIG. 10. FIG. 12 is a schematic diagram of a display panel provided by an embodiment of the present disclosure. FIG. 13 is a schematic diagram of partial structure in FIG. 12. FIG. 14 is a schematic diagram of a display panel provided by an embodiment of the present disclosure. FIG. 15 is a schematic diagram of partial structure in FIG. 14. FIG. 16 is a schematic diagram of a display panel provided by an embodiment of the present disclosure. FIG. 17 is a schematic diagram of partial structure in FIG. 16. FIG. 10 illustrates a display panel 1001, FIG. 12 illustrates a display panel 1002, FIG. 14 illustrates a display panel 1003, and FIG. 16 illustrates a display panel 1004.

As illustrated in FIG. 10 and FIG. 11, the third portion DT03 includes a main trace P30 located between the first via hole V1 and the second via hole V2, at least one third portion DT03 of the plurality of third portions DT03 of the plurality of second-type data lines DTn includes a compensation trace P3, the compensation trace P3 of the third portion DT03 is located at least one end of the main trace P30 of the third portion DT03.

For example, as illustrated in FIG. 10 and FIG. 11, lengths of the plurality of third portions DT03 of the plurality of second-type data lines DTn are equal or a ratio of a length difference between two adjacent third portions DT03 and an average length of the two adjacent third portions DT03 is less than or equal to 5%. For a further example, the ratio of a length difference between two adjacent third portions DT03 and an average length of the two adjacent third portions DT03 is less than or equal to 2%.

For example, as illustrated in FIG. 10 and FIG. 11, a ratio of a length difference between two third portions DT03 with the largest length difference and an average length of the two third portions DT03 with the largest length difference is less than or equal to 5%. For further example, the ratio of a length difference between two third portions DT03 with the largest length difference and an average length of the two third portions DT03 with the largest length difference is less than or equal to 2%.

In the display panel provided by the embodiments of the present disclosure, by providing the compensation trace P3 to reduce the length difference between the plurality of third portions DT03 and reduce the length difference of the plurality of second-type data lines DTn, thereby alleviating the display defects, improving the display uniformity, and improving the display quality.

In the embodiments of the present disclosure, member A and member B that are adjacent to each other refer to that no other member A and no other member B are provided between the member A and the member B, but another member different from the member A and the member B may be provided between the member A and the member B, two adjacent members A refer to that no other member A is provided between the two members A.

For example, as illustrated in FIG. 10 and FIG. 12, the plurality of third portions DT03 form a rectangle, in other embodiments, for example, as illustrated in FIG. 14, a plurality of third portions DT03 form a parallelogram.

For example, in the embodiments of the present disclosure, a shape formed by a plurality of members refers to the shape of a figure formed by connecting end points of respective members in the plurality of members, or the shape of a figure formed by an outer contour line of respective members. For example, the plurality of third portions DT03 forming a rectangle refers to that a line connecting end points or an outer contour line of the third portions DT03 forms the rectangle, and other members and other shapes are similar to this, which will not be repeated.

For example, as illustrated in FIG. 10 and FIG. 11, the compensation trace P3 of the third portion DT03 includes a first compensation trace P31, the first compensation trace P31 is located at one end of the third portion DT03, in the second direction Y, lengths of a plurality of first compensation traces P31 gradually change.

For example, as illustrated in FIG. 10 and FIG. 11, in the second direction Y, the lengths of the plurality of first compensation traces P31 gradually increase or decrease. For example, as illustrated in FIG. 10 and FIG. 11, the lengths of the plurality of first compensation traces P31 gradually increase in a direction from bottom to top.

For example, as illustrated in FIG. 10 and FIG. 11, the plurality of first compensation traces P31 form a trapezoid or triangle. For example, the plurality of first compensation traces P31 form a right trapezoid or an isosceles triangle.

For example, as illustrated in FIG. 10 and FIG. 11, the compensation trace of the third portion DT03 further includes a second compensation trace P32, the first compensation trace P31 and the second compensation trace P32 are located at both ends of the third portion DT03, respectively, lengths of a plurality of second compensation traces P32 gradually change. In the second direction Y, a length change trend of the plurality of first compensation traces P31 is the same as a length change trend of the plurality of second compensation traces P32.

For example, as illustrated in FIG. 10 and FIG. 11, the main trace, the first compensation trace P31, and the second compensation trace P32, of the third portion DT03, are of an integral structure.

For example, as illustrated in FIG. 10 and FIG. 11, the second-type data line DTn further includes a fourth portion DT04 and a fifth portion DT05, the fourth portion DT04 extends in the second direction Y, the fifth portion DT05 extends in the first direction X, the first portion DT01 is connected with the fourth portion DT04 by the fifth portion DT05, the fifth portion DT05 is connected with the first portion DT01 through a third via hole V3, and the fifth portion DT05 is connected with the fourth portion DT04 through a fourth via hole V4, the fifth portion DT05 includes a main trace P50 located between the third via hole V3 and the fourth via hole V4, at least one fifth portion DT05 of a plurality of fifth portions DT05 of the plurality of second-type data lines DTn includes a compensation trace P5, the compensation trace P5 of the fifth portion DT05 is located at least one end of the main trace P50 of the fifth portion DT05.

For example, as illustrated in FIG. 10 and FIG. 11, lengths of the plurality of fifth portions DT05 of the plurality of second-type data lines DTn are equal or a ratio of a length difference between two adjacent fifth portions DT05 and an average length of the two adjacent fifth portions DT05 is less than or equal to 5%. For further example, the ratio of a length difference between two adjacent fifth portions DT05 and an average length of the two adjacent fifth portions DT05 is less than or equal to 2%.

For example, a ratio of a length difference between two fifth portions DT05 with the largest length difference and an average length of the two fifth portions DT05 with the largest length difference is less than or equal to 5%. For further example, the ratio of a length difference between two fifth portions DT05 with the largest length difference and an average length of the two fifth portions DT05 with the largest length difference is less than or equal to 2%.

In the display panel provided by the embodiments of the present disclosure, by providing the compensation trace P5 to reduce the length difference between the plurality of fifth portions DT05 and reduce the length difference of the plurality of second-type data lines DTn, thereby alleviating the display defects, improving the display uniformity, and improving the display quality.

For example, as illustrated in FIG. 10 and FIG. 12, the plurality of fifth portions DT05 form a rectangle, in other embodiments, for example, as illustrated in FIG. 14, a plurality of fifth portions DT05 form a parallelogram.

For example, as illustrated in FIG. 10 and FIG. 11, the compensation trace of the fifth portion DT05 includes a third compensation trace P53, the third compensation trace P53 is located at one end of the fifth portion DT05, in the second direction Y, lengths of a plurality of third compensation traces P53 gradually change.

For example, as illustrated in FIG. 10 and FIG. 11, in the second direction Y, the lengths of the plurality of third compensation traces P53 gradually increase or decrease. For example, as illustrated in FIG. 10 and FIG. 11, the lengths of the plurality of third compensation traces P53 gradually increase in a direction from bottom to top.

For example, as illustrated in FIG. 10 and FIG. 11, the plurality of third compensation traces P53 form a trapezoid or triangle. For example, the plurality of third compensation traces P53 form a right trapezoid or an isosceles triangle.

For example, as illustrated in FIG. 10 and FIG. 11, the compensation trace of the fifth portion DT05 further includes a fourth compensation trace P54, the third compensation trace P53 and the fourth compensation trace P54 are located at both ends of the fifth portion DT05, respectively, lengths of a plurality of fourth compensation traces P54 gradually change. In the second direction Y, a length change trend of the plurality of third compensation traces P53 is the same as a length change trend of the plurality of fourth compensation traces P54.

For example, as illustrated in FIG. 10 and FIG. 11, the main trace P50, the third compensation trace P53, and the fourth compensation trace P54, of the fifth portion DT05, are of an integral structure.

For example, as illustrated in FIG. 10 and FIG. 11, the first portion DT01 includes a main trace P10 located between the first via hole V1 and the third via hole V3, at least one first portion DT01 of a plurality of first portions DT01 of the plurality of second-type data lines DTn includes a compensation trace P1, the compensation trace P1 is located at least one end of the main trace P10 of the first portion DT01.

For example, as illustrated in FIG. 10 and FIG. 11, lengths of the plurality of first portions DT01 of the plurality of second-type data lines DTn are equal or a ratio of a length difference between two adjacent first portions DT01 and an average length of the two adjacent first portions DT01 is less than or equal to 5%. For further example, the ratio of the length difference between two adjacent first portions DT01 and the average length of the two adjacent first portions DT01 is less than or equal to 2%.

For example, a ratio of a length difference between two first portions DT01 with the largest length difference and an average length of the two first portions DT01 with the largest length difference is less than or equal to 5%. For further example, the ratio of the length difference between two first portions DT01 with the largest length difference and the average length of the two first portions DT01 with the largest length difference is less than or equal to 2%.

In the display panel provided by the embodiments of the present disclosure, by providing the compensation trace P1 to reduce the length difference between the plurality of first portions DT01 and reduce the length difference of the plurality of second-type data lines DTn, thereby alleviating the display defects, improving the display uniformity, and improving the display quality.

For example, as illustrated in FIG. 10 and FIG. 11, the plurality of first portions DT01 form a rectangle, in other embodiments, for example, as illustrated in FIG. 16, a plurality of first portions DT01 form a parallelogram.

For example, as illustrated in FIG. 10 and FIG. 11, the compensation trace P1 of the first portion DT01 includes a fifth compensation trace P15, the fifth compensation trace P15 is located at one end of the first portion DT01, in the first direction X, lengths of a plurality of fifth compensation traces P15 gradually change.

For example, as illustrated in FIG. 10 and FIG. 11, in the first direction X, the lengths of the plurality of fifth compensation traces P15 gradually increase or decrease. For example, as illustrated in FIG. 10 and FIG. 11, the lengths of the plurality of fifth compensation traces P15 gradually increase in a direction from left to right.

For example, as illustrated in FIG. 10 and FIG. 11, the plurality of fifth compensation traces P15 form a trapezoid or triangle. For example, the plurality of fifth compensation traces P15 form a right trapezoid or an isosceles triangle.

For example, as illustrated in FIG. 10 and FIG. 11, the compensation trace of the first portion DT01 further includes a sixth compensation trace P16, the fifth compensation trace P15 and the sixth compensation trace P16 are located at both ends of the main trace of the first portion DT01, respectively, lengths of a plurality of sixth compensation traces P16 gradually change. In the first direction X, a length change trend of the plurality of fifth compensation traces P15 is the same as a length change trend of the plurality of sixth compensation traces P16.

For example, as illustrated in FIG. 10 and FIG. 11, the main trace, the fifth compensation trace P15, and the sixth compensation trace P16 of the first portion DT01 are of an integral structure.

For example, the fourth portion DT04 includes a main trace P40 located between the fourth via hole V4 and the second display region R2, at least one fourth portion DT04 of a plurality of fourth portions DT04 of the plurality of second-type data lines DTn includes a compensation trace P4, the compensation trace P4 of the fourth portion DT04 is located at one end of the main trace P40 of the fourth portion DT04 away from the second display region R2.

For example, lengths of a plurality of the fourth portions DT04 of the plurality of second-type data lines DTn are equal or a ratio of a length difference between two adjacent fourth portions DT04 and an average length of the two adjacent fourth portions DT04 is less than or equal to 5%. For further example, the ratio of the length difference between two adjacent fourth portions DT04 and the average length of the two adjacent fourth portions DT04 is less than or equal to 2%.

For example, a ratio of a length difference between two fourth portions DT04 with the largest length difference and an average length of the two fourth portions DT04 with the largest length difference is less than or equal to 5%. For further example, the ratio of the length difference between two fourth portions DT04 with the largest length difference and the average length of the two fourth portions DT04 with the largest length difference is less than or equal to 2%.

In the display panel provided by the embodiments of the present disclosure, by providing the compensation trace P4 to reduce the length difference between the plurality of fourth portions DT04 and reduce the length difference of the plurality of second-type data lines DTn, thereby alleviating the display defects, improving the display uniformity, and improving the display quality.

For example, as illustrated in FIG. 10 and FIG. 11, the plurality of fourth portions DT04 form a rectangle or a parallelogram.

For example, as illustrated in FIG. 10 and FIG. 11, the compensation trace of the fourth portion DT04 includes a seventh compensation trace P47, the seventh compensation trace P47 is located at one end of the fourth portion DT04, in the second direction Y, lengths of a plurality of seventh compensation traces P47 gradually change.

For example, in the first direction X, the lengths of the plurality of seventh compensation traces P47 gradually increase or decrease. For example, the lengths of the plurality of seventh compensation traces P47 gradually decrease in a direction from left to right.

For example, as illustrated in FIG. 10 and FIG. 11, the plurality of seventh compensation traces P47 form a trapezoid or triangle. For example, the plurality of seventh compensation traces P47 form a right trapezoid or an isosceles triangle.

For example, as illustrated in FIG. 10 to FIG. 17, lengths of the plurality of the second-type data lines DTn are equal or a ratio of a length difference and an average length of the plurality of second-type data lines DTn is less than or equal to 5%. For further example, lengths of the plurality of the second-type data lines DTn are equal or the ratio of the length difference and the average length of the plurality of second-type data lines DTn is less than or equal to 2%.

For example, a ratio of a length difference between two second-type data lines DTn with the largest length difference and an average length of the two second-type data lines DTn with the largest length difference is less than or equal to 5%. For further example, the ratio of the length difference between two second-type data lines DTn with the largest length difference and the average length of the two second-type data lines DTn with the largest length difference is less than or equal to 2%.

In the display panel provided by the embodiments of the present disclosure, by providing the compensation trace to reduce the length difference between the plurality of second-type data lines DTn, thereby alleviating the display defects, improving the display uniformity, and improving the display quality.

For example, as illustrated in FIG. 10 to FIG. 17, the length of the second-type data line DTn is greater than the length of the first-type data line DTm. Because the lengths of the plurality of second-type data lines DTn are equal or approximately equal, and lengths of the first-type data lines DTm are equal or approximately equal, different demura (removing dark stripes) solutions can be used to correspond to the first-type data line DTm and the second-type data line DTn, respectively, so as to alleviate the display defects of dark vertical stripes and improve the display effect.

For example, a ratio of a length of the first-type data line DTm to a length of the second-type data line DTn is greater than or equal to 0.85 and less than or equal to 0.95.

Referring to FIG. 6A, FIG. 8 to FIG. 17, the display panel further includes a dummy data line DM, the dummy data line DM is separated from the first portion DT01 of the second-type data line DTn, the dummy data line DM is located between two first-type data lines DTm, and is separated from the first portion DT01 of a second-type data line DTn located between the two first-type data lines DTm. For example, a portion of the second portion DT02 of the second-type data line DTn and the third portion DT03 of the second-type data line DTn are not located between the two first-type data lines DTm. For example, the dummy data line DM is not input with a data signal as that on the data line DT. For example, the dummy data line DM can be connected with, but not limited to, a constant voltage line. For example, a pixel circuit overlapping with the dummy data line DM can be a dummy pixel circuit, and the dummy pixel circuit is not connected with the light-emitting element.

For example, as illustrated in FIG. 6A, FIG. 8 to FIG. 17, in order to improve etch uniformity, the display panel further includes a plurality of dummy data lines DM. For example, a plurality of dummy data lines DM, the first portion DT01 of the second-type data line DTn, and the second portion DT02 of the second-type data line DTn are all located in the same layer.

As illustrated in FIG. 10 and FIG. 11, for the display panel 1001, after the compensation trace is provided, compared with a case without the compensation trace, the resistance of the second-type data line DTn does not change significantly, the capacitance on the third portion DT03 and the fifth portion DT05 of the second-type data line DTn with the first portion DT01 closest to the second display region increases from an original 15.96 fF to 212.8 fF, which significantly reduces the capacitance difference of different second-type data lines DTn. The capacitance difference of the second-type data line DTn of the display panel provided by the embodiments of the present disclosure may reach 0.5%.

As illustrated in FIG. 12 and FIG. 13, for the display panel 1002, compared with the display panel illustrated in FIG. 8, the compensation trace is provided, compared with the display panel illustrated in FIG. 10, a position of the connection hole is adjusted, and therefore after the compensation trace is provided, compared with a case without providing the compensation trace, a length of the original shortest connection line (shortest third portion DT03 and shortest fifth portion DT05) increases, a length of the original longest connection line (the longest third portion DT03 and the longest fifth portion DT05) decreases, which can reduce the resistance difference of the second-type data lines DTn, the resistance of the shortest second-type data line DTn is increased to 3956 Ω, and the resistance of the longest second-type data line DTn is reduced to 4196 Ω, the resistance difference is small, the resistance difference is about 5%, and on the basis of the above reduction of capacitance difference, the resistance difference is further reduced and the display effect is improved.

As illustrated in FIG. 10, the display panel includes a compensation structure 81, a compensation structure 82, a compensation structure 83, and a compensation structure 84. As illustrated in FIG. 10, the display panel includes a centerline a3, the centerline a3 extends in the first direction X, the second display region R2 is symmetrical with respect to the centerline a3, and symmetrical with respect to the centerline a0. The centerline a0 and the centerline a3 divide the display panel into four regions, and the compensation structure 81, the compensation structure 82, the compensation structure 83, and the compensation structure 84 are located in the four regions, respectively. For example, the compensation structure includes a compensation trace for the data line DTn. For example, the compensation structure 81 includes a plurality of compensation traces for the third portions DT03, the compensation structure 82 includes a plurality of compensation traces for the fifth portions DT05, the compensation structure 83 includes a plurality of compensation traces for the fifth portions DT05, and the compensation structure 84 includes a plurality of compensation traces for the third portions DT03. The display panel provided by the embodiments of the present disclosure takes that the second-type data line DTn is arranged symmetrically with respect to the centerline a0 as an example. Therefore, the compensation structure 81 and the compensation structure 84 are arranged symmetrically with respect to the centerline a0, the compensation structure 82 and the compensation structure 83 are arranged symmetrically with respect to the centerline a0. Of course, in some embodiments, the compensation structure 81 and the compensation structure 82 may be arranged symmetrically with respect to the centerline a1, and the compensation structure 83 and the compensation structure 84 may be arranged symmetrically with respect to the centerline a1. As illustrated in FIG. 10, the centerline a1 intersects with the centerline a0. In some embodiments, the centerline a1 is perpendicular to the centerline a0. In some embodiments, the centerline a1 may coincide with the centerline a3.

Because the second-type data lines DTn in the display panel are left-right symmetrical with respect to the centerline a0, the compensation structure 81 and the compensation structure 82 are described as an example.

Compared with the display panel 1001 illustrated in FIG. 10, in the display panel 1002 illustrated in FIG. 12, the position and an arrangement trend of the connection holes are different. As illustrated in FIG. 10, for the compensation structure 81, a line connecting the connection holes forms a trapezoid with an upper base at the top and a lower base at the bottom, and for the compensation structure 82, a line connecting the connection holes forms a trapezoid with an upper base at the bottom and a lower base at the top. In a trapezoid, the length of the upper base is less than the length of the lower base. As illustrated in FIG. 12, for the compensation structure 81, a line connecting the connection holes forms a trapezoid with an upper base at the bottom and a lower base at the top, and for the compensation structure 82, a line connecting the connection holes forms a trapezoid with an upper base at the top and a lower base at the bottom.

Compared with the display panel 1001 illustrated in FIG. 10, in the display panel 1003 illustrated in FIG. 14, an arrangement of the compensation trace is different, for the compensation structure 81, the compensation trace is located on one side of the main trace of the third portion DT03, and is located on a side of the main trace of the third portion away from the centerline a0.

Compared with the display panel 1001 illustrated in FIG. 10, in the display panel 1004 illustrated in FIG. 16, an arrangement of the compensation trace of the first portion DT01 is different. As illustrated in FIG. 10, the compensation trace P1 includes a fifth compensation trace P15 and a sixth compensation trace P16, the fifth compensation trace P15 and the sixth compensation trace P16 are located on both sides of the main trace P10 of the first portion DT01, respectively, and the plurality of the first portions DT01 forms a rectangle. As illustrated in FIG. 16, the compensation trace P1 is located on one side of the main trace P10 of the first portion DT01, and the plurality of first portions DT01 forms a parallelogram.

Figure 18:
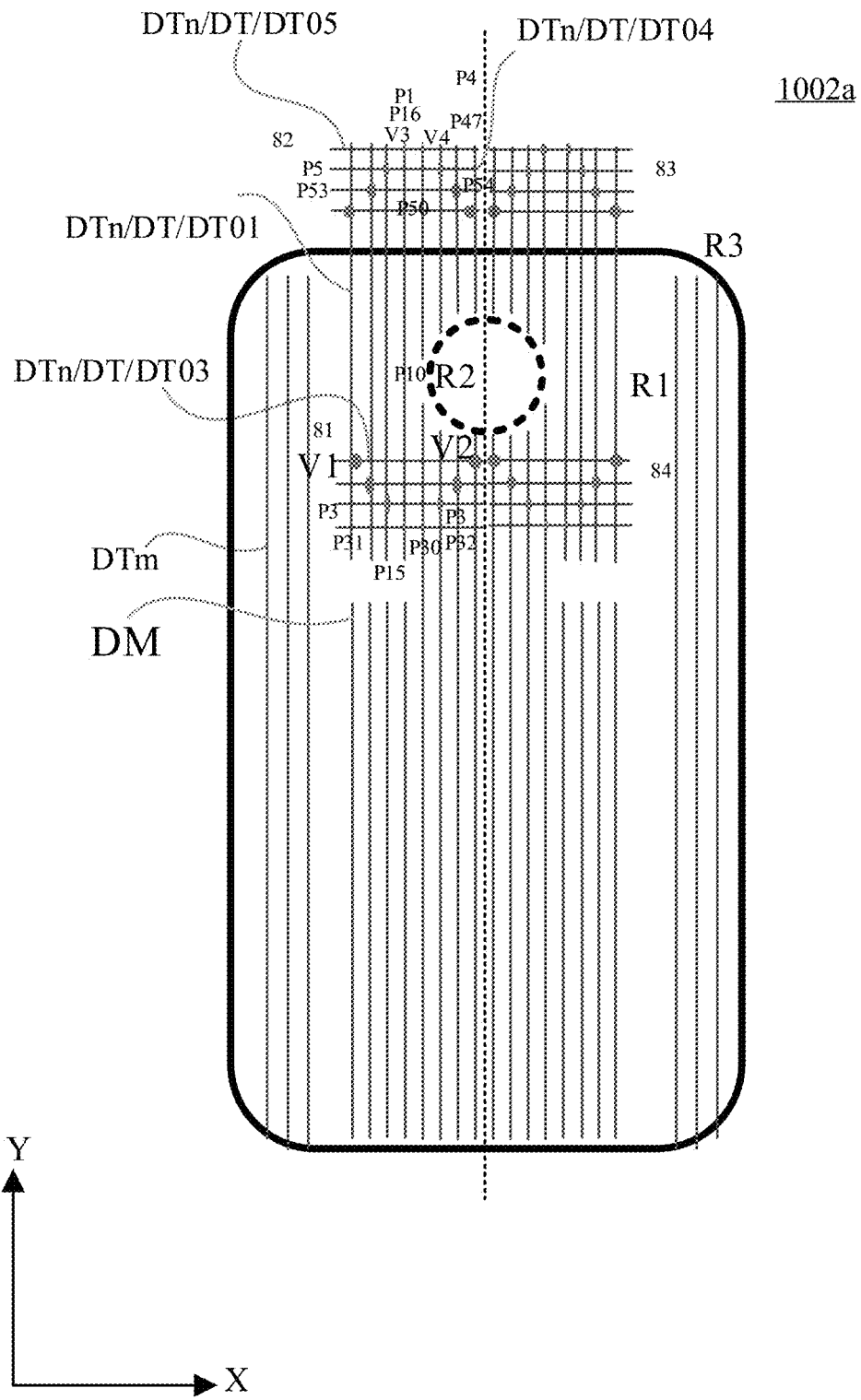
FIG. 18 is a schematic diagram of a display panel provided by an embodiment of the present disclosure.
Figure 19A:
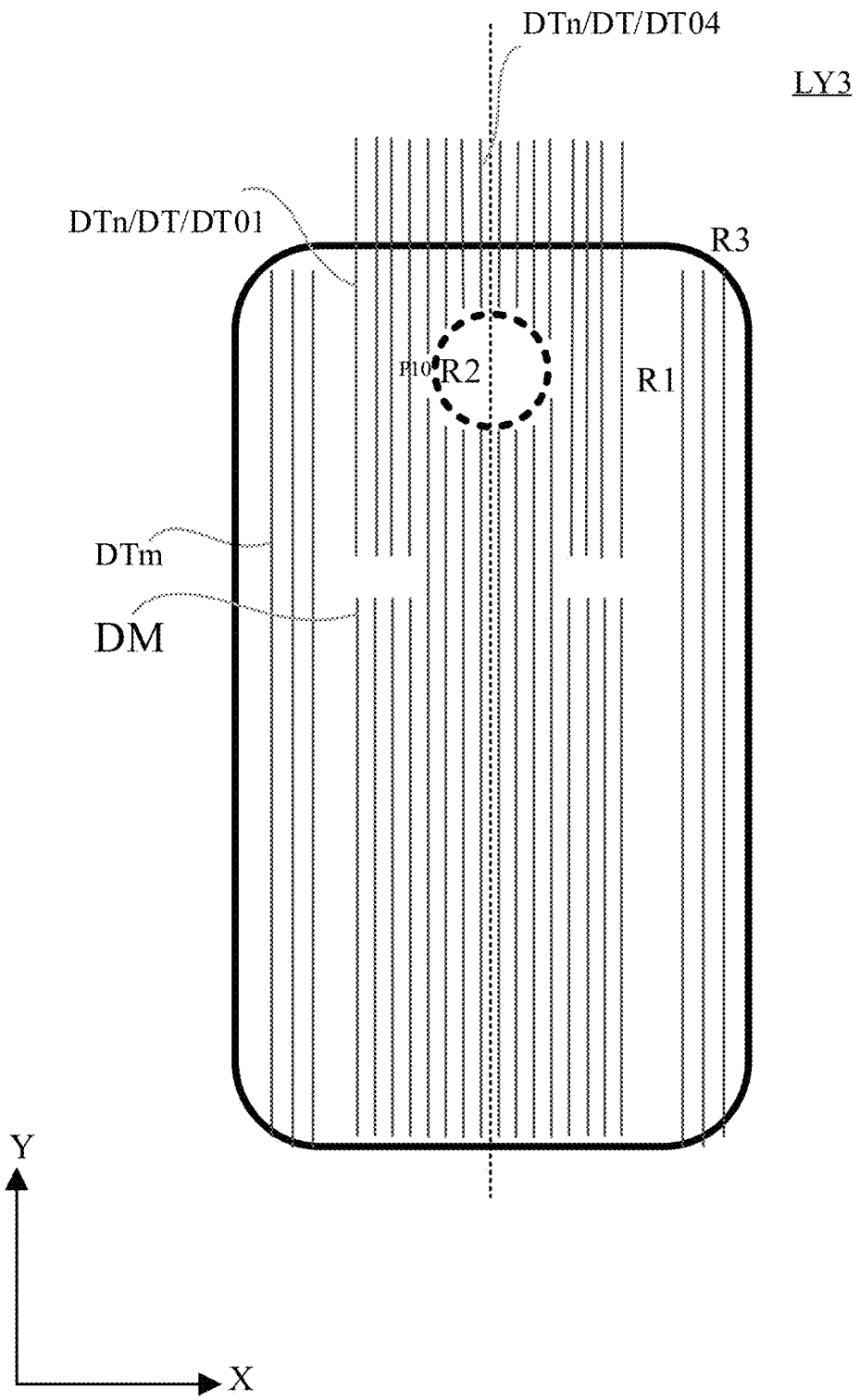
FIG. 19A is a conductive pattern layer in FIG. 18.
Figure 19B:
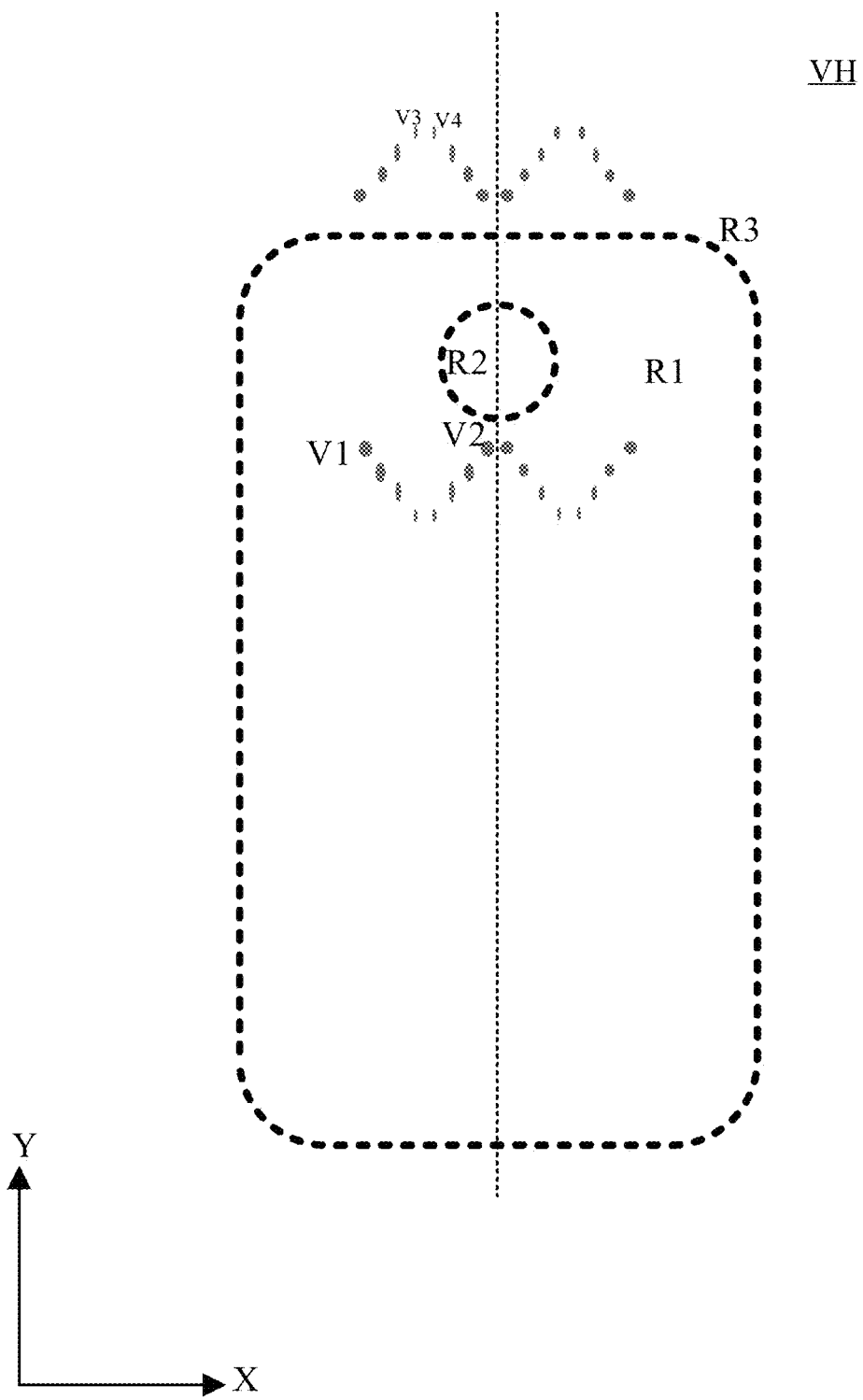
FIG. 19B is a via hole layer in FIG. 18.
Figure 19C:
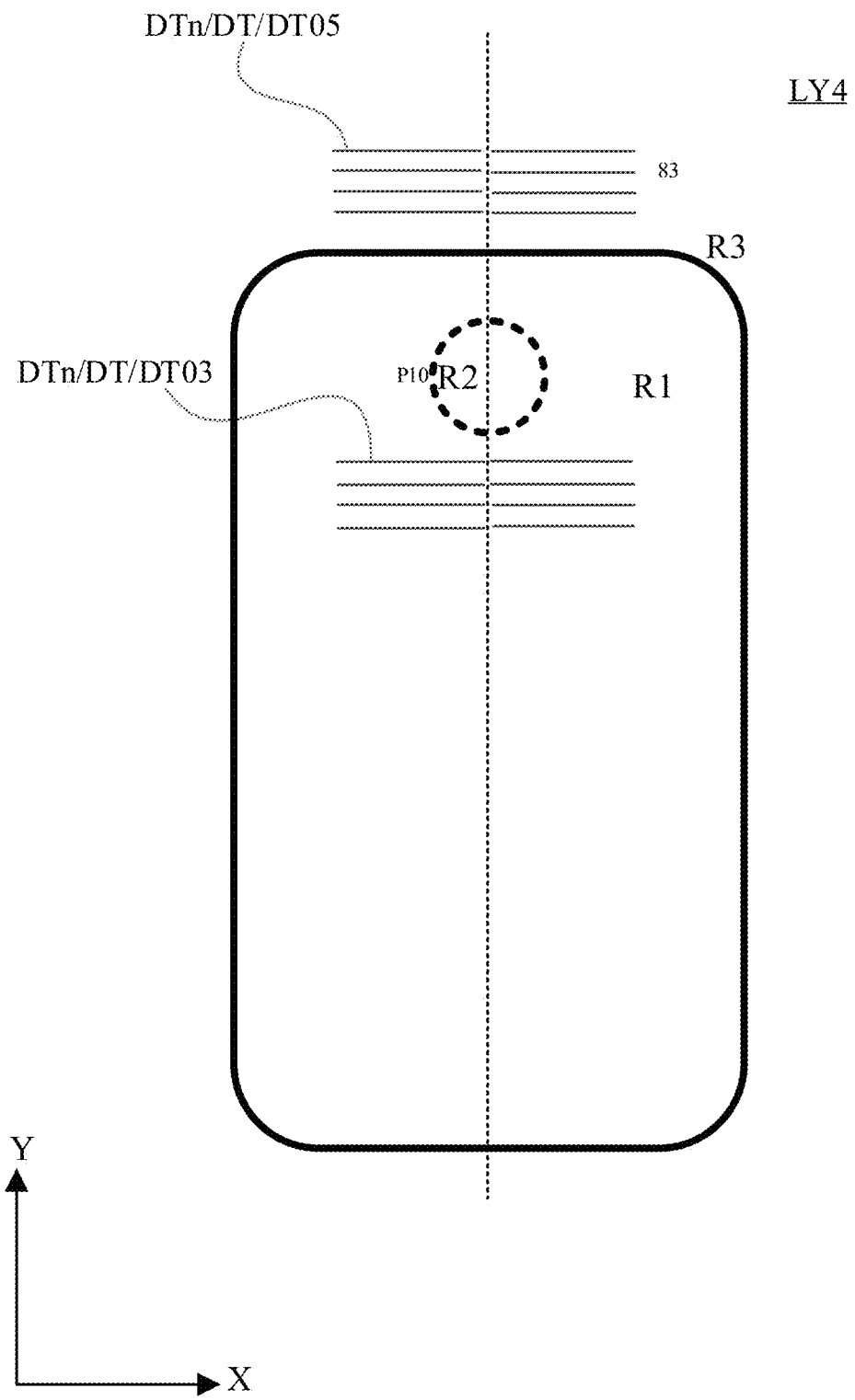
FIG. 19C is another conductive pattern layer in FIG. 18.

FIG. 18 is a schematic diagram of a display panel provided by an embodiment of the present disclosure. FIG. 18 illustrates a display panel 1002a. FIG. 19A illustrates the conductive pattern layer LY3, FIG. 19B illustrates a via hole layer VH, and FIG. 19C illustrates the conductive pattern layer LY4. As illustrated in FIG. 18 to FIG. 19C, one second-type data line DTn is formed by segments of portions located in two conductive pattern layers, and the main trace and the compensation trace of each portion of the data line DTn are of an integral structure, and are located in the same layer. Of course, in other embodiments, the main trace and the compensation trace of each portion of the data line DTn may not be of an integral structure, and are located in different layers, and the main trace may be connected with the compensation trace through a via hole.

As illustrated in FIG. 10, FIG. 12 and FIG. 16, for the compensation structure 81, for one same third portion DT03, in the case where compensation traces are provided on both sides of the main trace of the third portion DT03, respectively, the length of the compensation traces on the left side and the right side may be equal or not equal. For example, as illustrated in FIG. 10, FIG. 12 and FIG. 16, in some embodiments, for one same third portion DT03, the length of the first compensation trace P31 is greater than the length of the second compensation trace P32. For example, in other embodiments, for one same third portion DT03, the length of the first compensation trace P31 is equal to the length of the second compensation trace P32. The first compensation trace P31 and the second compensation trace P32 can be connected with the main trace P30 through via holes, respectively, or can be integrated with the main trace P30 to form an integral structure.

As illustrated in FIG. 10, FIG. 12 and FIG. 16, for the compensation structure 82, for one same fifth portion DT05, in the case where compensation traces are provided on both sides of the main trace of the fifth portion DT05, respectively, the lengths of the compensation traces on the left side and the right side may be equal. For example, in some embodiments, for one same fifth portion DT05, the length of the third compensation trace P53 is greater than the length of the fourth compensation trace P54. In other embodiments, for one same fifth portion DT05, the length of the third compensation trace P53 is equal to the length of the fourth compensation trace P54. The third compensation trace P53 and the fourth compensation trace P54 can be connected with the main trace P50 through via holes, respectively, or can be integrated with the main trace P50 to form an integral structure.

For one same first portion DT01, the length of the fifth compensation trace P15 may be greater than or equal to the length of the sixth compensation trace P16. In the case where the fifth portion DT05 is located in the peripheral region R3, the length of the fifth compensation trace P15 is greater than the length of the sixth compensation trace P16. In the case where the fifth portion DT05 is located in the first display region R1, the length of the fifth compensation trace P15 can be equal to the length of the sixth compensation trace P16.

As illustrated in FIG. 14, for the compensation structure 81, for one same third portion DT03, the compensation trace is arranged on the side of the main trace of the third portion DT03 away from the centerline a0.

As illustrated in FIG. 14, for the compensation structure 82, for one same fifth portion DT05, the compensation trace is arranged on the side of the main trace of the fifth portion DT05 away from the centerline a0.

Of course, in other embodiments, for one same portion of the data line DTn, lengths of the compensation traces of each main trace may also be equal. For example, the one same portion of the data line DTn may refer to the first portion DT01, the third portion DT03, the fourth portion DT04, or the fifth portion DT05.

In an embodiment of the present disclosure, the compensation structure 81 may include a compensation trace of the first portion DT01 in addition to the compensation trace of the third portion DT03. In the embodiments of the present disclosure, the compensation structure 82 may include at least one of the compensation trace of the first portion DT01 and the compensation trace of the fourth portion DT04 in addition to the compensation trace of the fifth portion DT05.

Figure 20:
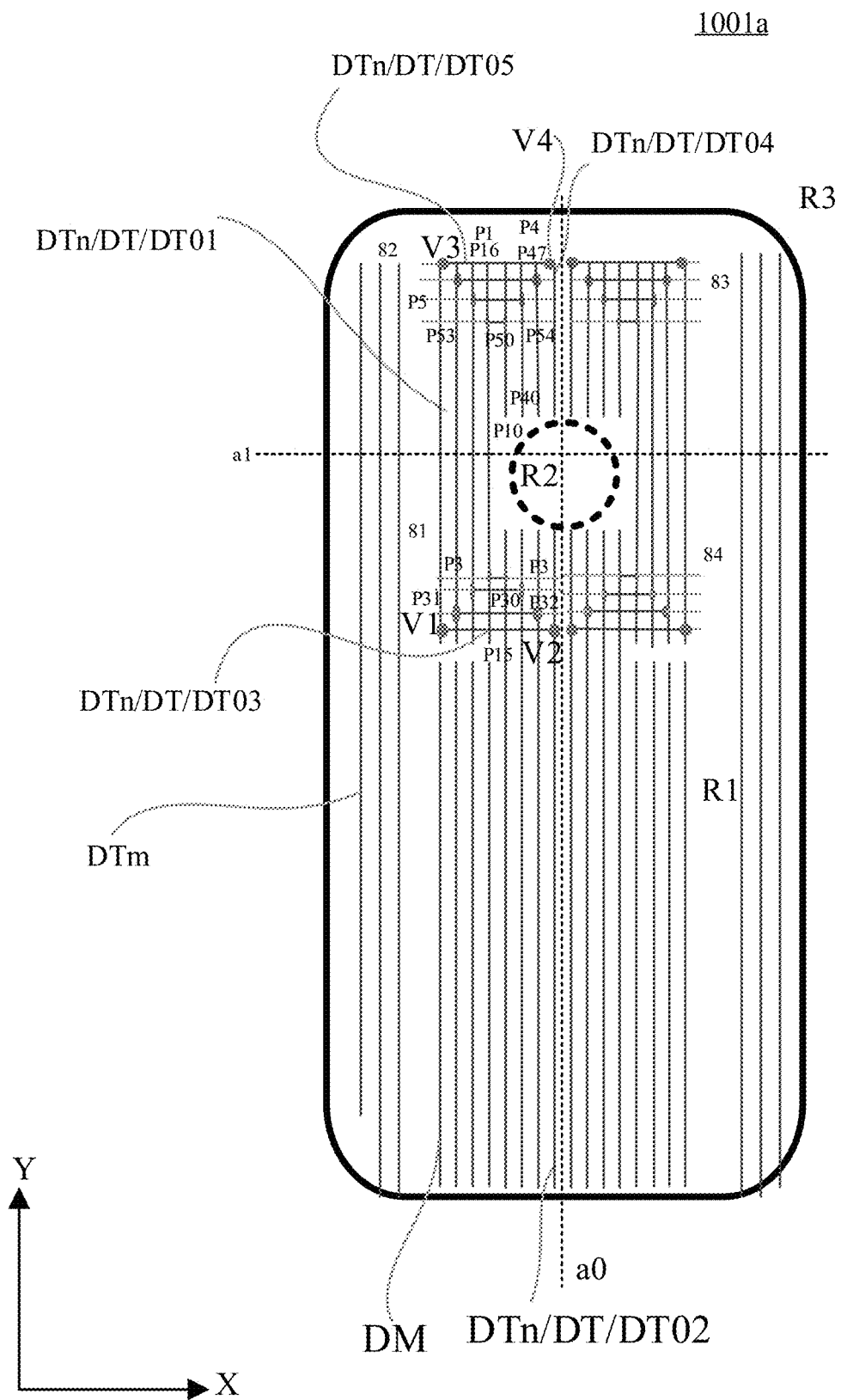
FIG. 20 is a schematic diagram of a display panel provided by an embodiment of the present disclosure.

FIG. 20 is a schematic diagram of a display panel provided by an embodiment of the present disclosure. As illustrated in FIG. 20, in the display panel 1001a, the first portion DT01, the fourth portion DT04, and the fifth portion DT05 are all located in the first display region R1. The first portion DT01, the fourth portion DT04, and the fifth portion DT05 in other embodiments of the present disclosure may also be adjusted to be located in the first display region R1.

Figure 21:
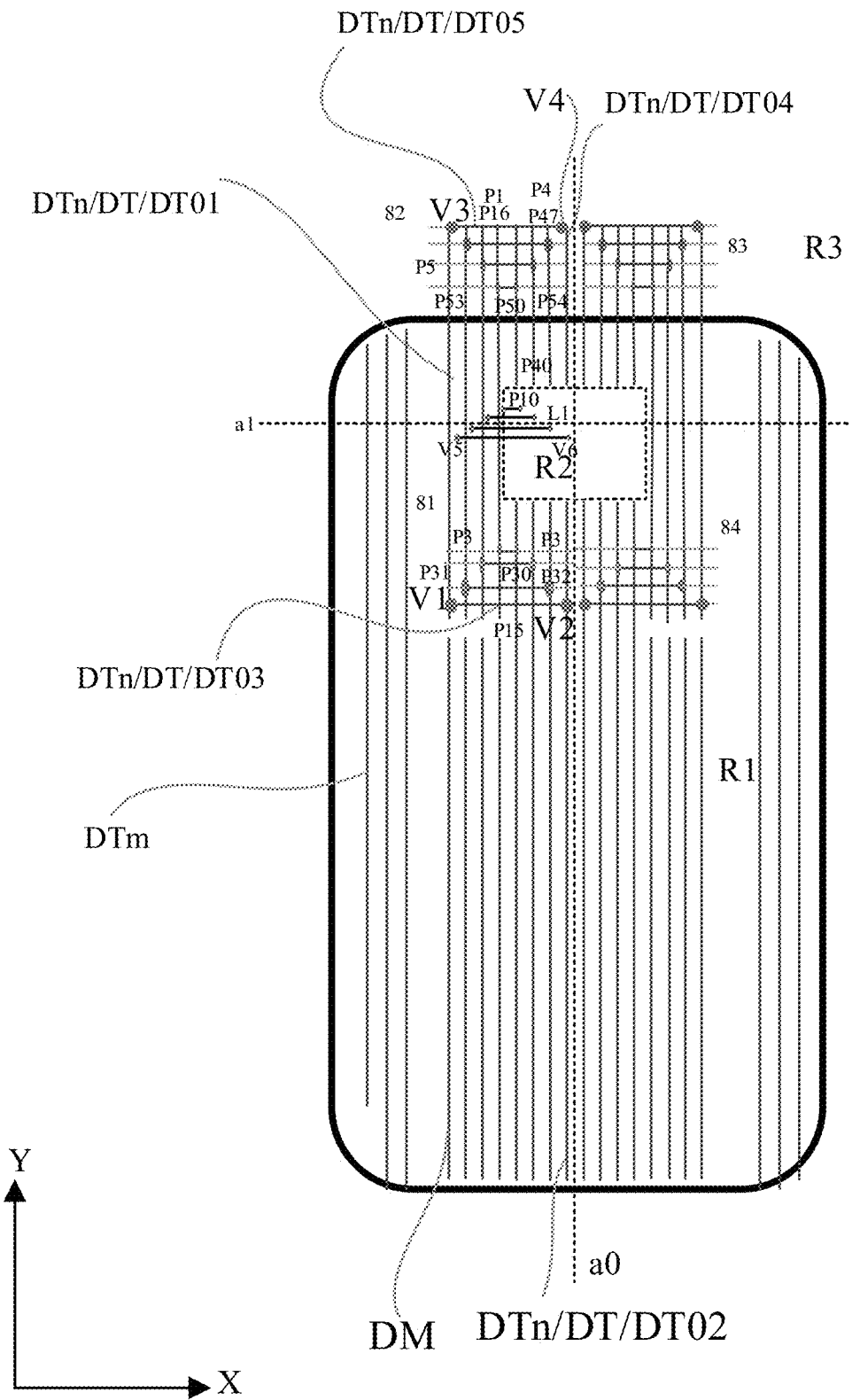
FIG. 21 is a schematic diagram of a display panel provided by an embodiment of the present disclosure.

FIG. 21 is a schematic diagram of a display panel provided by an embodiment of the present disclosure. As illustrated in FIG. 20, in the display panel 1001b, one end of the conductive line L1 is connected with the second-type pixel circuit through a via hole V5, and the other end of the conductive line L1 is connected with the second-region light-emitting element through a via hole V6.

As illustrated in FIG. 20, the compensation structure 81 and the compensation structure 82 are arranged on both sides of a plurality of conductive lines L1, respectively, an orthographic projection of the compensation structure 81 on the base substrate does not overlap with an orthographic projection of the plurality of conductive lines L1 on the base substrate, and an orthographic projection of the compensation structure 82 on the base substrate does not overlap with an orthographic projection of the plurality of conductive lines L1 on the base substrate. Similarly, an orthographic projection of the compensation structure 83 on the base substrate does not overlap with an orthographic projection of the plurality of conductive lines L1 on the base substrate, and an orthographic projection of the compensation structure 84 on the base substrate does not overlap with an orthographic projection of the plurality of conductive lines L1 on the base substrate. As illustrated in FIG. 20, the compensation structure 81 includes a plurality of third portions DT03, an orthographic projection of the main trace and the compensation trace of the third portion DT03 on the base substrate does not overlap with an orthographic projection of the plurality of conductive lines L1 on the base substrate. As illustrated in FIG. 20, the compensation structure 82 includes a plurality of fifth portions DT05, an orthographic projection of the main trace and the compensation trace of the fifth portion DT05 on the base substrate does not overlap with an orthographic projection of the plurality of conductive lines L1 on the base substrate. Other compensation structures are similar to that as described above and will not be repeated here.

Figure 22A:
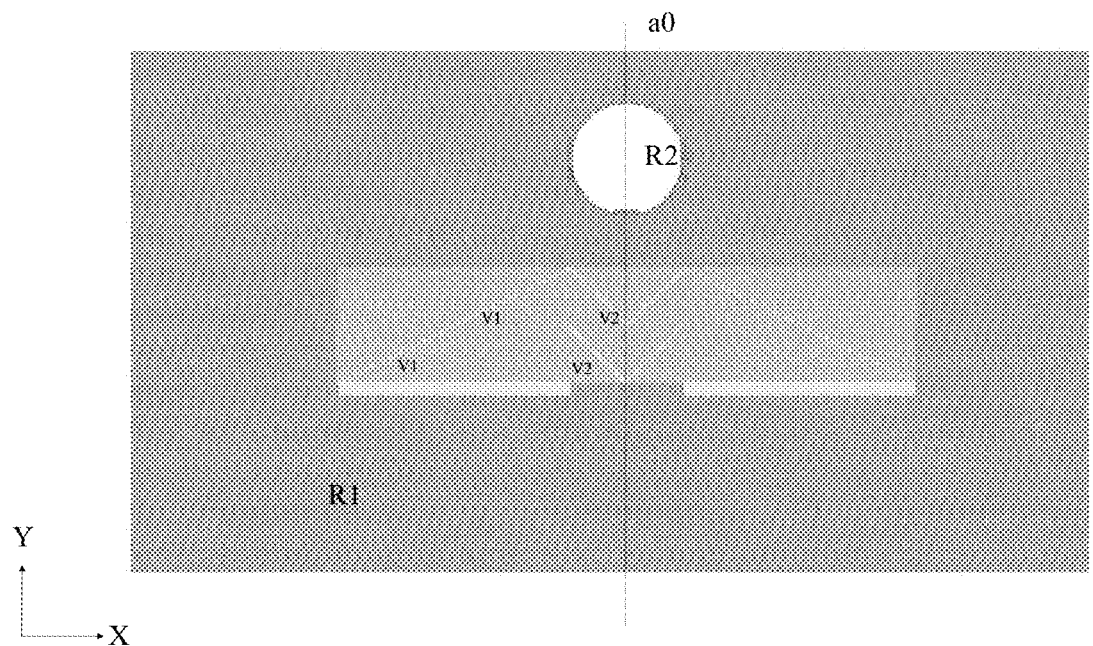
FIG. 22A is a schematic diagram illustrating a part of a display panel provided by an embodiment of the present disclosure.

FIG. 22A is a schematic diagram illustrating a part of a display panel provided by an embodiment of the present disclosure. FIG. 22A illustrates an arrangement trend of the first via hole V1 and an arrangement trend of the second via hole V2.

Figure 22B:
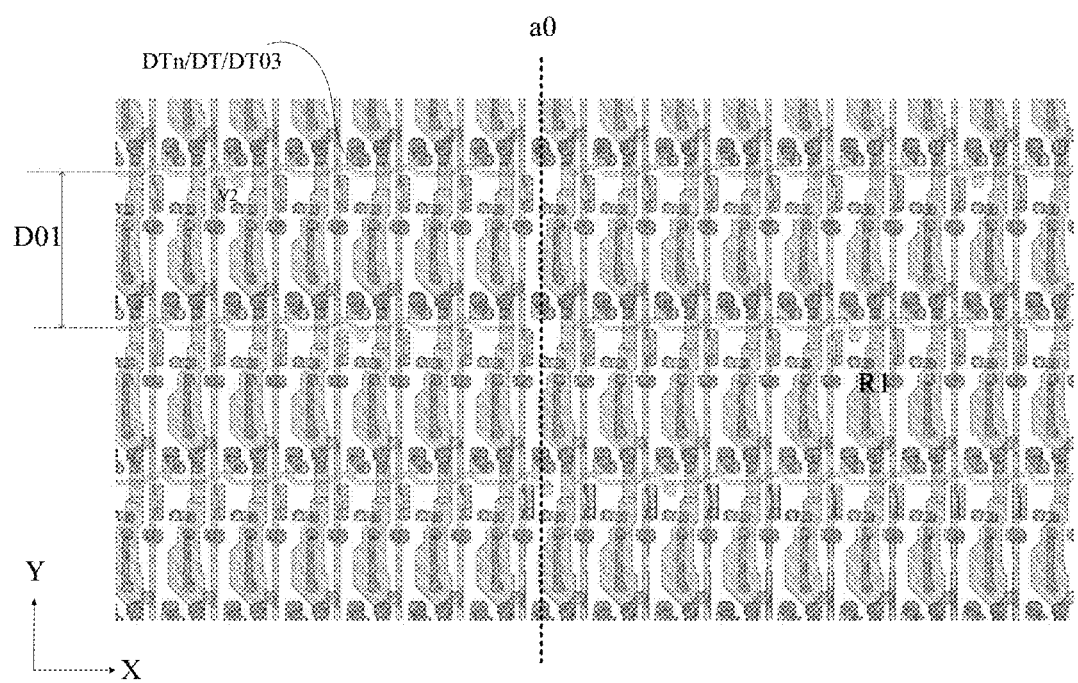
FIG. 22B is a schematic diagram illustrating a part of a display panel provided by an embodiment of the present disclosure.

FIG. 22B is a schematic diagram illustrating a part of a display panel provided by an embodiment of the present disclosure. As illustrated in FIG. 22B, the third portions DT03 on both sides of the centerline a0 are spaced apart from each other.

Figure 22C:
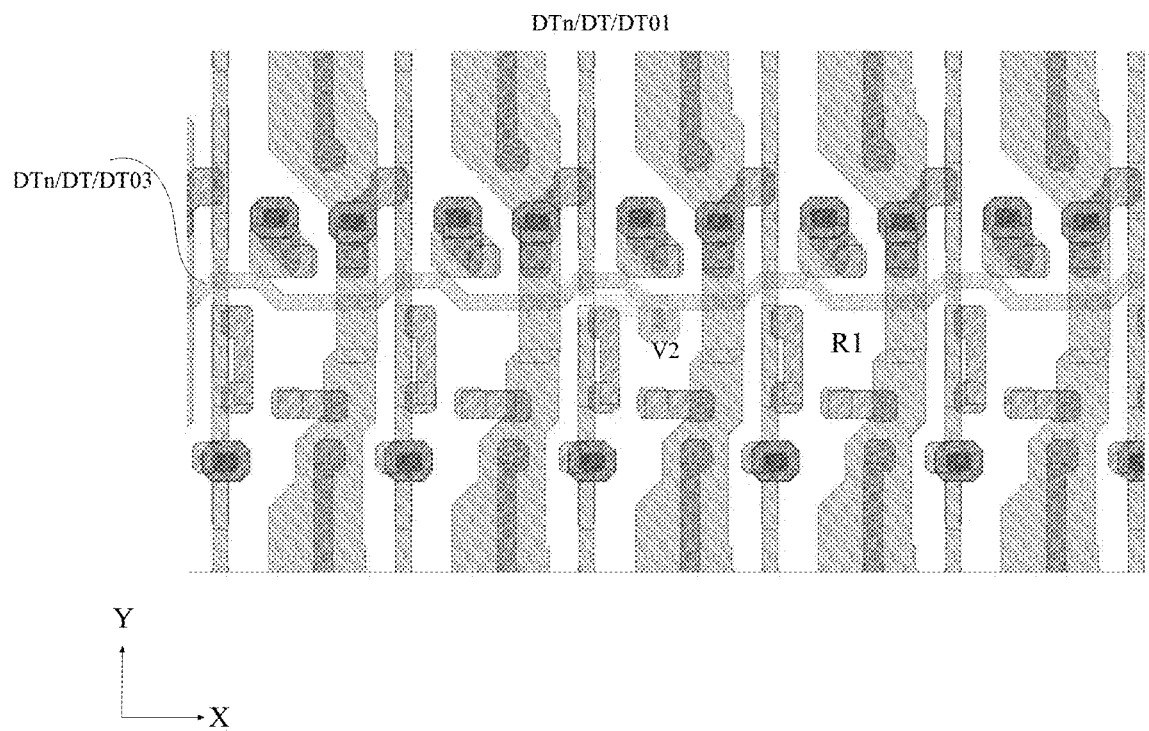
FIG. 22C is a schematic diagram illustrating a part of a display panel provided by an embodiment of the present disclosure.

FIG. 22C is a schematic diagram illustrating a part of a display panel provided by an embodiment of the present disclosure. As illustrated in FIG. 22C, the third portion DT03 is connected with the first portion DT01 through the second via hole V2.

As illustrated in FIG. 22B and FIG. 22C, the overall trend of the third portion DT03 extends in the first direction X. The third portion DT03 may not be in a form of a straight line, so can portions of other traces or data line, not required to be the straight line, as long as the overall trend extends in a given direction.

Figure 22D:
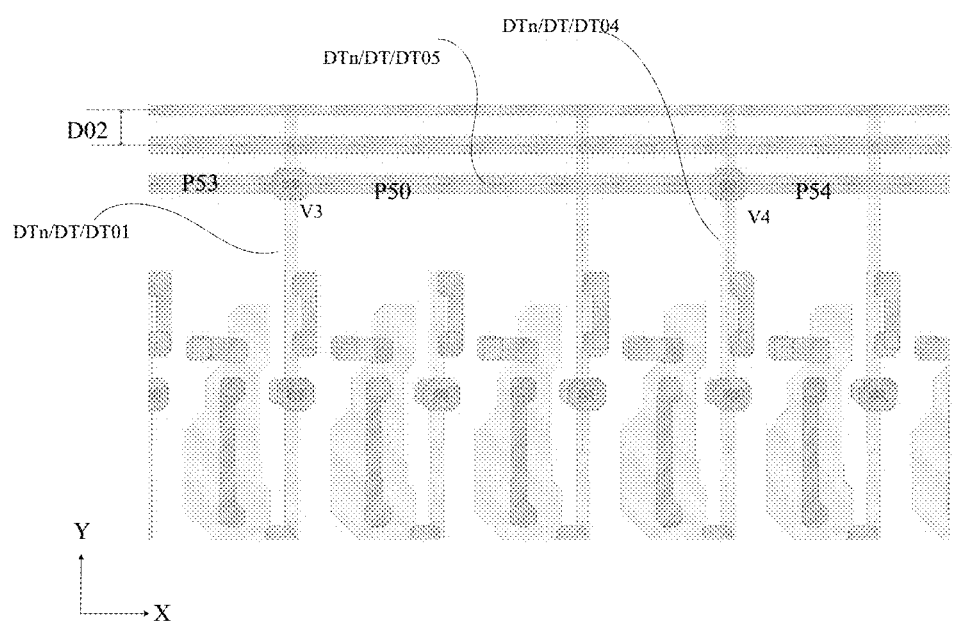
FIG. 22D is a schematic diagram illustrating a part of a display panel provided by an embodiment of the present disclosure.
Figure 22E:
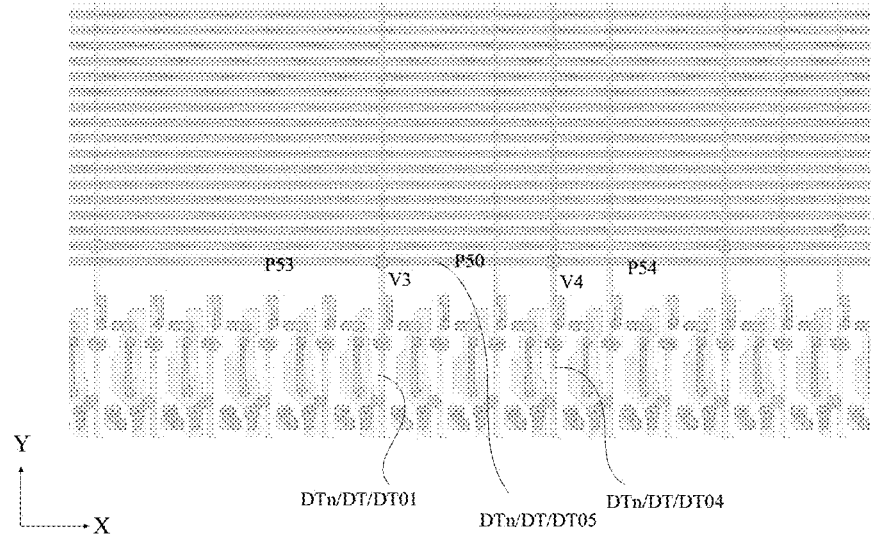
FIG. 22E is a schematic diagram illustrating a part of a display panel provided by an embodiment of the present disclosure.

FIG. 22D is a schematic diagram illustrating a part of a display panel provided by an embodiment of the present disclosure. FIG. 22E is a schematic diagram illustrating a part of a display panel provided by an embodiment of the present disclosure.

As illustrated in FIG. 22D and FIG. 22E, the fifth portion DT05 is connected with the first portion DT01 through the third via hole V3, the fifth portion DT05 is connected with the fourth portion DT04 through the fourth via hole V4.

As illustrated in FIG. 22B and FIG. 22D, a distance D01 of adjacent third portions DT03 in the second direction Y is greater than a distance D02 of adjacent fifth portions DT05 in the second direction Y. From an arrangement of the third portion DT03 and the fifth portion DT05, it can be seen that a distance between the main traces of the adjacent third portions DT03 in the second direction Y is greater than the distance D02 of the main traces of the adjacent fifth portions DT05 in the second direction Y. From the arrangement of the third portion DT03 and the fifth portion DT05, it can be seen that a distance of the compensation traces of the adjacent third portions DT03 in the second direction Y is greater than the distance D02 of the compensation traces of the adjacent fifth portions DT05 in the second direction Y. The display panel illustrated in FIG. 22B and FIG. 22D is described by taking that the fifth portion DT05 is located in the peripheral region R3 as an example.

In the case where the fifth portion DT05 is located in the first display region R1, the distance D01 of adjacent third portions DT03 in the second direction Y is equal to the distance D02 of adjacent fifth portions DT05 in the second direction Y. From the arrangement of the third portion DT03 and the fifth portion DT05, it can be seen that the distance of the main traces of the adjacent third portions DT03 in the second direction Y is equal to the distance D02 of the main traces of the adjacent fifth portions DT05 in the second direction Y. From the arrangement of the third portion DT03 and the fifth portion DT05, it can be seen that the distance of the compensation traces of the adjacent third portions DT03 in the second direction Y is equal to the distance D02 of the compensation traces of the adjacent fifth portions DT05 in the second direction Y.

Embodiments of the present disclosure are described by taking that the third portion DT03 and the fifth portion DT05 are both provided with the compensation trace as an example. In other embodiments, it is further to provide the compensation trace in one of the third portion DT03 and the fifth portion DT05, while another one of the third portion DT03 and the fifth portion DT05 is not provided with the compensation trace.

Embodiments of the present disclosure are described by taking that the first portion DT01 is provided with the compensation trace as an example. In other embodiments, the first portion DT01 may be not provided with the compensation trace.

Embodiments of the present disclosure are described by taking that the fourth portion DT04 is arranged with the compensation trace as an example. In other embodiments, the fourth portion DT04 may be not provided with the compensation trace That is, in the display panel provided by embodiments of the present disclosure, at least one of the first portion DT01, the third portion DT03, the fourth portion DT04, and the fifth portion DT05 may be provided with the compensation trace so that the lengths of the plurality of second-type data lines DTn are equal or approximately equal, so that the resistances of the plurality of second-type data lines DTn are equal or approximately equal, and/or the capacitances on the plurality of second-type data lines DTn are equal or approximately equal. For example, the resistances of the plurality of second-type data lines DTn being approximately equal may refer to that the resistance difference is less 5%. For example, the capacitances on the plurality of second-type data lines DTn being approximately equal may refer to that the capacitance difference is less that 5%.

For further example, the resistances of the plurality of second-type data lines DTn being approximately equal may refer to that the resistance difference is less than 3%. For further example, the resistances of the plurality of second-type data lines DTn being approximately equal may refer to that the resistance difference is less than 1%.

As illustrated in FIG. 6A, FIG. 8 to FIG. 17, the display panel includes a display region R0 and a peripheral region R3, the display region R0 includes a first display region R1 and a second display region R2. In other words, the base substrate has a display region R0 and a peripheral region R3, and the peripheral region R3 is located on at least one side of the display region R0.

In some figures of embodiments of the present disclosure, an outer boundary of the base substrate is not illustrated, the outer boundary of the base substrate may refer to FIG. 7. Each member of the display panel provided by the embodiments of the present disclosure may also take other forms or structures, and is not limited to situation illustrated in the figures.

For example, the conductive pattern layer LY2, the conductive pattern layer LY3, and the conductive pattern layer LY4 are made of conductive materials, for example, made of metal. For example, the conductive pattern layer LY2 is formed by metal materials such as nickel and aluminum, but is not limited thereto. For example, the conductive pattern layer LY3 is formed by titanium, aluminum and other materials, but is not limited thereto. For example, the conductive pattern layer LY3 or the conductive pattern layer LY4 adopts a structure in which three sub-layers of Ti/Al/Ti are arranged, respectively, but are not limited to this. For example, the base substrate can be a glass substrate or a polyimide substrate, but is not limited thereto, and can be selected according to needs.

For example, referring to FIG. 2 and FIG. 3, the pixel unit 100 is located on the base substrate BS, includes a pixel circuit 100a and a light-emitting element 100b, the pixel circuit 100a is configured to drive the light-emitting element 100b, the pixel circuit 100b includes a driving transistor T1 (referring to FIG. 23) and a data writing transistor T2 (referring to FIG. 23), the driving transistor is connected with the data writing transistor.

Figure 23:
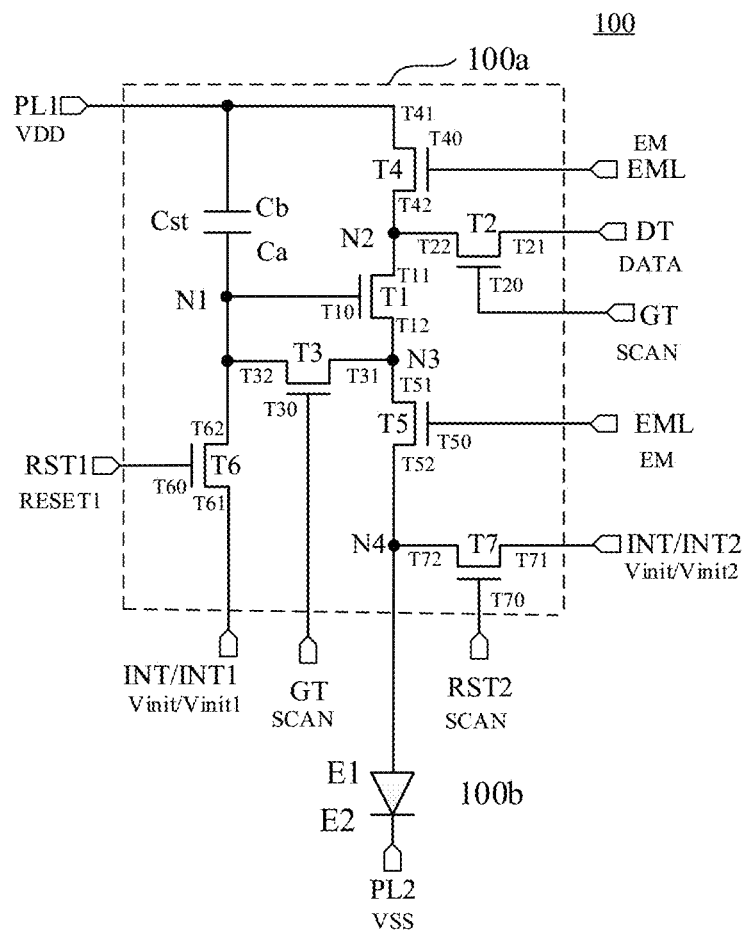
FIG. 23 is a schematic diagram of a pixel circuit in a display panel provided by an embodiment of the present disclosure.

For example, referring to FIG. 23 and FIG. 10B, the data line DT is connected with the data writing transistor T2, and is configured to provide a data signal (data voltage) to the pixel circuit 100a.

FIG. 23 is a schematic diagram of a pixel circuit in a display panel provided by an embodiment of the present disclosure. The pixel circuit illustrated in FIG. 23 may be a low temperature polysilicon (LTPS) AMOLED pixel circuit commonly used in the related art.

FIG. 23 illustrates a pixel circuit of one pixel unit of the display panel. As illustrated in FIG. 23, the pixel unit 100 includes the pixel circuit 100a and the light-emitting element 100b. The pixel circuit 100a includes six switching transistors (T2-T7), one driving transistor T1, and one storage capacitor Cst. The six switching transistors are a data writing transistor T2, a threshold compensation transistor T3, a first light-emitting control transistor T4, a second light-emitting control transistor T5, a first reset transistor T6, and a second reset transistor T7, respectively. The light-emitting element 100b includes a first electrode E1, a second electrode E2, and a light-emitting functional layer located between the first electrode E1 and the second electrode E2. For example, the first electrode E1 is an anode, and the second electrode E2 is a cathode. Generally, the threshold compensation transistor T3 and the first reset transistor T6 adopt double-gate thin film transistors (TFT) to reduce leakage current.

In some embodiments, the first electrode E1 may adopt at least one of transparent conductive metal oxide and silver, but it is not limited thereto. For example, the transparent conductive metal oxide includes indium tin oxide (ITO), but is not limited thereto. For example, the first electrode E1 may adopt a structure in which three sub-layers of ITO-Ag-ITO are arranged. In some embodiments, the second electrode E2 may adopt a metal of low work function, for example, may adopt at least one of magnesium and silver, but is not limited thereto.

As illustrated in FIG. 23, the display panel includes a gate line GT, a data line DT, a first power supply line PL1, a second power supply line PL2, a light-emitting control signal line EML, an initialization signal line INT, a reset control signal line RST, and the like. For example, the reset control signal line RST includes a first reset control signal line RST1 and a second reset control signal line RST2. The first power supply line PL1 is configured to provide a constant first voltage signal VDD to the pixel unit 100, the second power supply line PL2 is configured to provide a constant second voltage signal VSS to the pixel unit 100, and the first voltage signal VDD is greater than the second voltage signal VSS. The gate line GT is configured to provide a scan signal SCAN to the pixel unit 100, the data line DT is configured to provide a data signal DATA (data voltage VDATA) to the pixel unit 100, the light-emitting control signal line EML is configured to provide a light-emitting control signal EM to the pixel unit 100, the first reset control signal line RST1 is configured to provide a first reset control signal RESET1 to the pixel unit 100, and the second reset control signal line RST2 is configured to provide the scan signal SCAN to the pixel unit 100. The first initialization signal line INT1 is configured to provide a first initialization signal Vinit1 to the pixel unit 100. The second initialization signal line INT2 is configured to provide a second initialization signal Vinit2 to the pixel unit 100. For example, the first initialization signal Vinit1 and the second initialization signal Vinit2 are constant voltage signals, and their magnitudes may be between the first voltage signal VDD and the second voltage signal VSS, but are not limited thereto. For example, the first initialization signal Vinit1 and the second initialization signal Vinit2 may both be less than or equal to the second voltage signal VSS. For example, in some embodiments, the first initialization signal line INT1 and the second initialization signal line INT1 are connected with each other, and are both configured to provide an initialization signal Vinit to the pixel unit 100, that is, the first initialization signal line INT1 and the second initialization signal line INT2 are both referred to as an initialization signal line INT, and the first initialization signal Vinit1 and the second initialization signal Vinit2 are equal, and both are Vinit.

As illustrated in FIG. 23, the driving transistor T1 is electrically connected with the light-emitting element 100b, and outputs a driving current to drive the light-emitting element 100b to emit light under the control of the scan signal SCAN, the data signal DATA, the first voltage signal VDD, and the second voltage signal VSS.

For example, the light-emitting element 100b includes an organic light-emitting diode (OLED), and the light-emitting element 100b emits red light, green light, blue light, or white light under the driving of its corresponding pixel circuit 100a. For example, one pixel includes a plurality of pixel units. One pixel may include a plurality of pixel units that emit light of different colors. For example, one pixel includes a pixel unit that emits red light, a pixel unit that emits green light, and a pixel unit that emits blue light, but it is not limited thereto. The number of pixel units included in a pixel and the light output of each pixel unit can be determined according to needs.

For example, as illustrated in FIG. 23, a gate electrode T20 of the data writing transistor T2 is connected with the gate line GT, a first electrode T21 of the data writing transistor T2 is connected with the data line DT, and a second electrode T22 of the data writing transistor T2 is connected with a first electrode T11 of the driving transistor T1.

For example, as illustrated in FIG. 23, the pixel circuit 100a further includes the threshold compensation transistor T3, a gate electrode T30 of the threshold compensation transistor T3 is connected with the gate line GT, a first electrode T31 of the threshold compensation transistor T3 is connected with a second electrode T12 of the driving transistor T1, and a second electrode T32 of the threshold compensation transistor T3 is connected with a gate electrode T10 of the driving transistor T1.

For example, as illustrated in FIG. 23, the display panel further includes the light-emitting control signal line EML, and the pixel circuit 100a further includes the first light-emitting control transistor T4 and the second light-emitting control transistor T5. A gate electrode T40 of the first light-emitting control transistor T4 is connected with the light-emitting control signal line EML, a first electrode T41 of the first light-emitting control transistor T4 is connected with the first power supply line PL1, and a second electrode T42 of the first light-emitting control transistor T4 is connected with the first electrode T11 of the driving transistor T1. A gate electrode T50 of the second light-emitting control transistor T5 is connected with the light-emitting control signal line EML, a first electrode T51 of the second light-emitting control transistor T5 is connected with the second electrode T12 of the driving transistor T1, and a second electrode T52 of the second light-emitting control transistors T5 is connected with a first electrode E1 of the light-emitting element 100b.

As illustrated in FIG. 23, the first reset transistor T6 is connected with the gate electrode T10 of the driving transistor T1 and is configured to reset the gate electrode of the driving transistor T1, and the second reset transistor T7 is connected with the first electrode E1 of the light-emitting element 100b and is configured to reset the first electrode E1 of the light-emitting element 100b. The first initialization signal line INT1 is connected with the gate electrode of the driving transistor T1 through the first reset transistor T6. The second initialization signal line INT2 is connected with the first electrode E1 of the light-emitting element 100b through the second reset transistor T7. For example, the first initialization signal line INT1 and the second initialization signal line INT2 are connected with each other and are input with the same initialization signal, but not limited thereto. In some embodiments, the first initialization signal line INT1 and the second initialization signal line INT2 may also be insulated from each other and configured to input signals, respectively.

For example, as illustrated in FIG. 23, a first electrode T61 of the first reset transistor T6 is connected with the first initialization signal line INT1, a second electrode T62 of the first reset transistor T6 is connected with the gate electrode T10 of the driving transistor T1, a first electrode T71 of the second reset transistor T7 is connected with the second initialization signal line INT2, and a second electrode T72 of the second reset transistor T7 is connected with the first electrode E1 of the light-emitting element 100b. For example, as illustrated in FIG. 23, a gate electrode T60 of the first reset transistor T6 is connected with the first reset control signal line RST1, and a gate electrode T70 of the second reset transistor T7 is connected with the second reset control signal line RST2.

As illustrated in FIG. 23, the first power supply line PL1 is configured to provide the first voltage signal VDD to the pixel circuit 100a. The pixel circuit further includes the storage capacitor Cst, a first electrode Ca of the storage capacitor Cst is connected with the gate electrode T10 of the driving transistor T1, and a second electrode Cb of the storage capacitor Cst is connected with the first power supply line PL1.

For example, as illustrated in FIG. 23, the display panel further includes the second power supply line PL2, and the second power supply line PL2 is connected with a second electrode E2 of the light-emitting element 100b.

FIG. 23 illustrates a first node N1, a second node N2, a third node N3, and a fourth node N4.

In other embodiments of the present disclosure, pixel units with different numbers can be provided between two adjacent third portions DT03 in the second direction Y. Embodiments of the present disclosure do not limit the number of pixel units provided between two adjacent third portions DT03 in the second direction Y. Embodiments of the present disclosure do not limit the number of pixel units provided between adjacent first portions DT01 of the second-type data lines DTn.

In the embodiments of the present disclosure, the following situation is described as an example: for the second-type data line DTn, the closer the second portion DT02 is to the centerline a0, a length of a portion of the third portion DT03 between two via holes through which the third portion DT03 is respectively connected with the first portion DT01 and the second portion DT02 is larger. Those skilled in the art may adjust the connecting manner as needed, for example, in other embodiments, for the second-type data line DTn, the closer the second portion DT02 is to the centerline a0, the length of a portion of the third portion DT03 between two via holes through which the third portion DT03 is respectively connected with the first portion DT01 and the second portion DT02 is shorter.

At least one embodiment of the present disclosure provides a display device, including any one of the above-described display panels.

Figure 24:
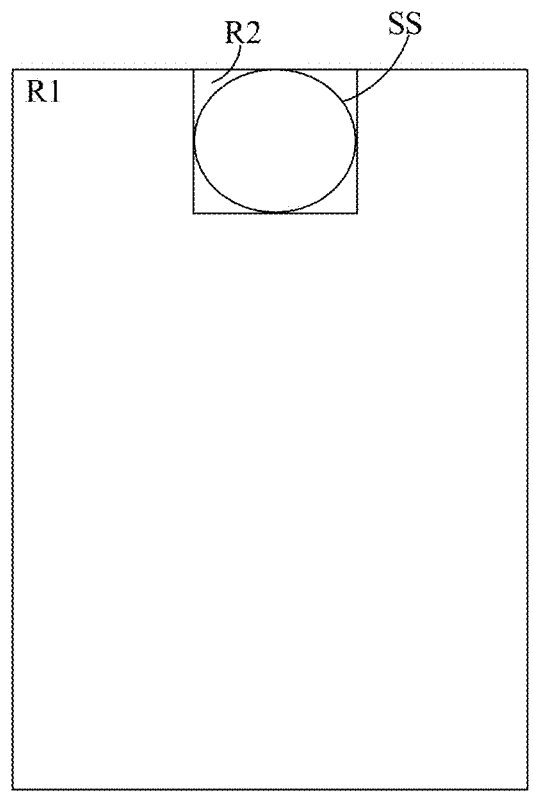
FIG. 24 and FIG. 25 are schematic diagrams of a display device provided by an embodiment of the present disclosure.
Figure 25:
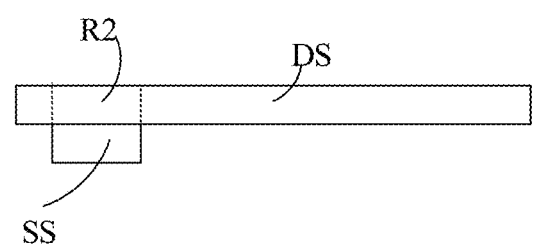

FIG. 24 and FIG. 25 are schematic diagrams of a display device provided by an embodiment of the present disclosure. As illustrated in FIG. 24 and FIG. 25, a photosensitive sensor SS is located on a side of the display panel DS and located in a second display region R2. Ambient light may be transmitted through the second display region R2 and sensed by the photosensitive sensor SS. As illustrated in FIG. 25, a side of the display panel where the photosensitive sensor SS is not provided is a display side, which can display images.

For example, the display device is a full-screen display device with an under-screen camera. For example, the display device includes products or components with display function that including the above-mentioned display panel, such as a TV, a digital camera, a mobile phone, a watch, a tablet computer, a laptop computer, a navigator, and the like.

Figure 26:
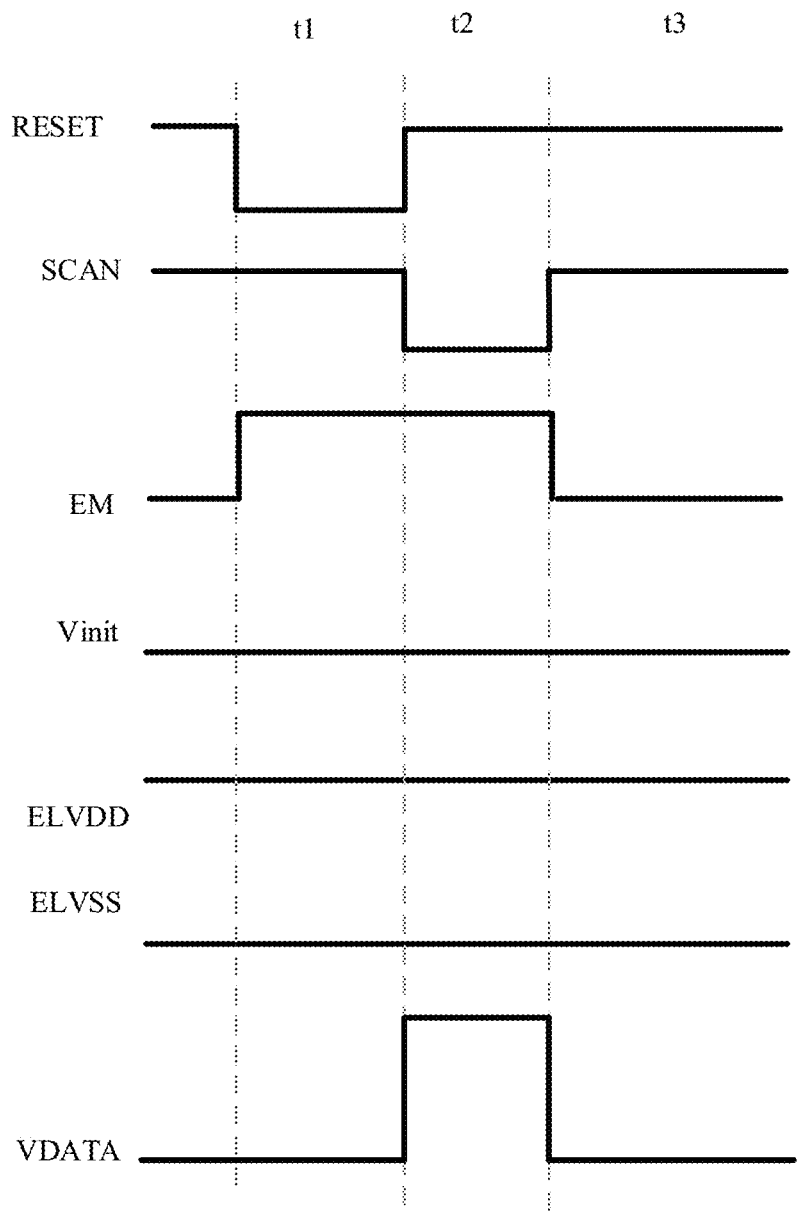
FIG. 26 is a working timing diagram of the pixel circuit illustrated in FIG. 23.

FIG. 26 is a working timing diagram of the pixel circuit illustrated in FIG. 23. As illustrated in FIG. 26, during one frame of display period, the driving method of the pixel unit includes a first reset stage t1, a data writing, threshold compensation and second reset stage t2, and a light-emitting stage t3. When the reset control signal RESET is at a low level, the gate electrode of the driving transistor T1 is reset, and when the scan signal SCAN is at a low level, the first electrode E1 (for example, the anode) of the light-emitting element 100b is reset. For example, as illustrated in FIG. 23, when the scan signal SCAN is at a low level, the data voltage VDATA is written, and the threshold voltage Vth of the driving transistor T1 is obtained at the same time, and the data voltage VDADA containing the data information on the data line is stored in the capacitor Cst. When the light-emitting control signal line EML is at a low level, the light-emitting element 100b emits light, and the voltage of the first node N1 (node of the gate electrode) is maintained by the storage capacitor Cst (the light-emitting stability of the light-emitting element 100b). In the driving process of the pixel circuit 10, in the light-emitting stage, the storage capacitor is used to maintain the voltage signal, so that the potential of the signal holding terminal can be kept constant, and a voltage is formed between the gate electrode and the source electrode of the driving transistor, thereby controlling the driving transistor to form a driving current, and then driving the light-emitting element 100b to emit light.

For example, the embodiments of the present disclosure are not limited to the specific pixel circuit illustrated in FIG. 23, and other pixel circuits that can realize compensation for the driving transistor may be adopted. The above description takes the 7T1C pixel circuit as an example, and the embodiments of the present disclosure include but are not limited to this. It should be noted that the embodiments of the present disclosure do not limit the number of thin film transistors and the number of capacitors included in the pixel circuit. For example, in some other embodiments, the pixel circuit of the display panel may also be a structure including other numbers of transistors, such as a 7T2C structure, a 6T1C structure, a 6T2C structure, or a 9T2C structure, which is not limited in the embodiments of the present disclosure. Of course, the display panel may also include pixel circuits with less than 7 transistors.

In the embodiments of the present disclosure, the elements located in the same layer can be formed by the same film layer through the same patterning process. For example, the elements located in the same layer may be located on the surface of the same element away from the base substrate.

It should be noted that, for the sake of clarity, in the drawings used to describe the embodiments of the present disclosure, the thickness of a layer or region is exaggerated. It can be understood that when an element such as a layer, film, region, or substrate is referred to as being "on" or "under" another element, the element can be "directly" "on" or "under" the other element, or there may be intermediate elements.

In the embodiments of the present disclosure, the patterning or patterning process may only include a photolithography process, or include a photolithography process and an etching step, or may include other processes for forming predetermined patterns such as printing and ink-jetting. The photolithography process refers to the process including film formation, exposure, development, etc., by using photoresist, mask plate, exposure machine, etc. to form patterns. The corresponding patterning process can be selected according to the structure formed in the embodiment of the present disclosure.

In the case of no conflict, the features in the same embodiment and different embodiments of the present disclosure can be combined with each other.

The above are only specific embodiments of the present disclosure, but the protection scope of the present disclosure is not limited thereto. Any person skilled in the art can easily conceive of changes or substitutions within the technical scope disclosed in the present disclosure, and these changes or substitutions should be covered within the protection scope of the present disclosure. Therefore, the protection scope of the present disclosure should be subject to the protection scope of the claims.

The invention claimed is:

1. A display panel, comprising:
   a base substrate;
   a pixel unit, located on the base substrate, comprising a pixel circuit and a light-emitting element, wherein the pixel circuit is configured to drive the light-emitting element; and
   a data line, connected with the pixel circuit, and configured to supply a data voltage to the pixel circuit, wherein
   the data line comprises a plurality of first-type data lines and a plurality of second-type data lines,
   the plurality of first-type data lines are arranged in a first direction, each of the plurality of first-type data lines extends in a second direction, and the first direction intersects with the second direction,
   each of the plurality second-type data lines comprises a first portion, a second portion, and a third portion, the first portion is connected with the second portion by the third portion, the third portion is connected with the first portion through a first via hole, the third portion is connected with the second portion through a second via hole, and the third portion comprises a main trace located between the first via hole and the second via hole,
   the first portion and the second portion both extend in the second direction, and the third portion extends in the first direction,
   at least one third portion of a plurality of third portions of the plurality of second-type data lines comprises a compensation trace, the compensation trace of the third portion is located at at least one end of the main trace of the third portion, lengths of the plurality of third portions of the plurality of second-type data lines are equal or a ratio of a length difference between two adjacent third portions and an average length of the two adjacent third portions is less than or equal to 5%.

2. The display panel according to claim 1, wherein the plurality of third portions form a rectangle or a parallelogram.

3. The display panel according to claim 1, wherein the compensation trace of the third portion comprises a first compensation trace, the first compensation trace is located at one end of the third portion, in the second direction, lengths of a plurality of first compensation traces gradually change.

4. The display panel according to claim 3, wherein in the second direction, the lengths of the plurality of first compensation traces gradually increase or gradually decrease.

5. The display panel according to claim 3, wherein the compensation trace of the third portion further comprises a second compensation trace, the first compensation trace and the second compensation trace are located at both ends of the third portion, respectively, lengths of a plurality of second compensation traces gradually change, in the second direction, a length change trend of the plurality of first compensation traces is the same as a length change trend of the plurality of second compensation traces.

6. The display panel according to claim 1, wherein the second-type data line further comprises a fourth portion and a fifth portion, the fourth portion extends in the second direction, the fifth portion extends in the first direction, the first portion is connected with the fourth portion by the fifth portion, the fifth portion is connected with the first portion through a third via hole, and the fifth portion is connected with the fourth portion through a fourth via hole, the fifth portion comprises a main trace located between the third via hole and the fourth via hole, at least one fifth portion of a plurality of fifth portions of the plurality of second-type data lines comprises a compensation trace, the compensation trace of the fifth portion is located at at least one end of the main trace of the fifth portion, lengths of a plurality of the fifth portions of the plurality of second-type data lines are equal or a ratio of a length difference between two adjacent fifth portions and an average length of the two adjacent fifth portions is less than or equal to 5%.

7. The display panel according to claim 6, wherein the compensation trace of the fifth portion comprises a third compensation trace, the third compensation trace is located at one end of the fifth portion, and in the second direction, lengths of a plurality of third compensation traces gradually change.

8. The display panel according to claim 6, wherein the compensation trace of the fifth portion further comprises a fourth compensation trace, the third compensation trace and the fourth compensation trace are located at both ends of the fifth portion, respectively, lengths of a plurality of fourth compensation traces gradually change, in the second direction, a length change trend of the plurality of third compensation traces is the same as a length change trend of the plurality of fourth compensation traces.

9. The display panel according to claim 6, wherein
the first portion comprises a main trace located between the first via hole and the third via hole,
at least one first portion of a plurality of first portions of the plurality of second-type data lines comprises a compensation trace, the compensation trace of the first portion is located at at least one end of the main trace of the first portion, lengths of the plurality of first portions of the plurality of second-type data lines are equal or a ratio of a length difference between two adjacent first portions and an average length of the two adjacent first portions is less than or equal to 5%.

10. The display panel according to claim 9, wherein the compensation trace of the first portion comprises a fifth compensation trace, the fifth compensation trace is located at one end of the first portion, in the first direction, lengths of a plurality of fifth compensation traces gradually change.

11. The display panel according to claim 9, wherein the compensation trace of the first portion further comprises a sixth compensation trace, the fifth compensation trace and the sixth compensation trace are located at both ends of the main trace of the first portion, respectively, lengths of a plurality of sixth compensation traces gradually change, in the first direction, a length change trend of the plurality of fifth compensation traces is the same as a length change trend of the plurality of sixth compensation traces.

12. The display panel according to claim 6, wherein
the fourth portion comprises a main trace located between the fourth via hole and the second display region,
at least one fourth portion of a plurality of fourth portions of the plurality of second-type data lines comprises a compensation trace, the compensation trace of the fourth portion is located at one end of the main trace of the fourth portion away from the second display region, lengths of the plurality of fourth portions of the plurality of second-type data lines are equal or a ratio of a length difference between two adjacent fourth portions and an average length of the two adjacent fourth portions is less than or equal to 5%.

13. The display panel according to claim 12, wherein the plurality of fourth portions form a rectangle or a parallelogram.

14. The display panel according to claim 12, wherein the compensation trace of the fourth portion comprises a seventh compensation trace, the seventh compensation trace is located at one end of the fourth portion, and in the first direction, lengths of a plurality of seventh compensation traces gradually change.

15. The display panel according to claim 1, wherein lengths of the plurality of second-type data lines are equal or a ratio of a length difference of the plurality of second-type data lines and an average length of the plurality of second-type data lines is less than or equal to 5%.

16. The display panel according to claim 1, wherein a length of the second-type data line is greater than a length of the first-type data line.

17. The display panel according to claim 1, wherein a ratio of a length of the first-type data line to a length of the second-type data line is greater than or equal to 0.85 and less than or equal to 0.95.

18. The display panel according to claim 1, wherein the base substrate comprises a first display region and a second display region, and the first display region is located on at least one side of the second display region,
the pixel unit comprises a first pixel unit and a second pixel unit, the pixel circuit and the light-emitting element of the first pixel unit are located in the first display region, the pixel circuit of the second pixel unit is located in the first display region, the light-emitting element of the second pixel unit is located in the second display region, the pixel circuit of the second pixel unit is connected with the light-emitting element of the second pixel unit by a conductive line, an orthographic projection of the compensation trace of the third portion on the base substrate does not overlap with an orthographic projection of the conductive line on the base substrate.

19. A display device, comprising the display panel according to claim 1.

20. The display device according to claim 19, further comprising a photosensitive sensor, wherein the photosensitive sensor is located on one side of the display panel.

* * * * *